United States Patent
Seok

(10) Patent No.: US 9,780,168 B2
(45) Date of Patent: Oct. 3, 2017

(54) IGBT WITH WAVED FLOATING P-WELL ELECTRON INJECTION

(71) Applicant: IXYS Corporation, Milpitas, CA (US)

(72) Inventor: Kyoung Wook Seok, Milpitas, CA (US)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 14/840,322

(22) Filed: Aug. 31, 2015

(65) Prior Publication Data

US 2017/0062563 A1    Mar. 2, 2017

(51) Int. Cl.
*H01L 29/06* (2006.01)
*H01L 29/08* (2006.01)
*H01L 29/739* (2006.01)
*H01L 29/10* (2006.01)

(52) U.S. Cl.
CPC ...... *H01L 29/0696* (2013.01); *H01L 29/0804* (2013.01); *H01L 29/0821* (2013.01); *H01L 29/1095* (2013.01); *H01L 29/7396* (2013.01)

(58) Field of Classification Search
None
See application file for complete search history.

(56) References Cited

U.S. PATENT DOCUMENTS

| | | | | |
|---|---|---|---|---|
| 4,888,627 A | * | 12/1989 | Pattanayak | ......... H01L 29/7302 257/113 |
| 4,912,541 A | * | 3/1990 | Baliga | ................ H01L 29/7455 257/122 |
| 5,294,816 A | * | 3/1994 | Shekar | ................ H01L 29/7455 257/139 |
| 5,298,769 A | * | 3/1994 | Omura | ................ H01L 29/7455 257/122 |
| 5,317,171 A | * | 5/1994 | Shekar | ................ H01L 29/7455 257/138 |

(Continued)

OTHER PUBLICATIONS

J. Baliga, Power Semiconductor Devices, Chapter 9, pp. 543-571 (copyright 1996).

(Continued)

*Primary Examiner* — Olik Chaudhuri
*Assistant Examiner* — Kien Ly
(74) *Attorney, Agent, or Firm* — Imperius Patent Works; T. Lester Wallace; Darien K. Wallace

(57) ABSTRACT

An IGBT includes a floating P well, and a floating N+ well that extends down into the floating P well. A bottom surface of the floating P well has a waved contour so that it has thinner portions and thicker portions. When the device is on, electrons flow laterally from an N+ emitter, and through a first channel region. Some electrons pass downward, but others pass laterally through the floating N+ well to a local bipolar transistor located at a thinner portion of the floating P type well. The transistor injects electrons down into the N– drift layer. Other electrons pass farther through the floating N+ well, through the second channel region, and to an electron injector portion of the N– drift layer. The extra electron injection afforded by the floating well structures reduces $V_{CE(SAT)}$. The waved contour is made without adding any masking step to the IGBT manufacturing process.

23 Claims, 16 Drawing Sheets

(56) References Cited

U.S. PATENT DOCUMENTS

| | | | | |
|---|---|---|---|---|
| 5,319,222 | A * | 6/1994 | Shekar | H01L 29/749 257/138 |
| 5,444,273 | A * | 8/1995 | Ueno | H01L 29/749 257/138 |
| 5,498,884 | A * | 3/1996 | Ajit | H01L 29/7455 257/132 |
| 5,614,738 | A | 3/1997 | Iwamuro | 257/147 |
| 5,757,034 | A | 5/1998 | Ajit | 257/133 |
| 5,894,139 | A * | 4/1999 | Otsuki | H01L 29/0696 257/139 |
| 5,936,267 | A * | 8/1999 | Iwamuro | H01L 29/7455 257/147 |
| 5,939,736 | A * | 8/1999 | Takahashi | H01L 29/102 257/147 |
| 6,121,089 | A | 9/2000 | Zeng et al. | 438/268 |
| 6,664,595 | B1 | 12/2003 | Yun et al. | 257/342 |
| 7,211,837 | B2 | 5/2007 | Tomomatsu et al. | 257/156 |
| 7,638,839 | B2 | 12/2009 | Arai et al. | 257/331 |
| 8,686,513 | B1 * | 4/2014 | Seok | H01L 29/4238 257/379 |
| 2012/0025262 | A1 * | 2/2012 | Niimura | H01L 29/0626 257/139 |
| 2012/0139036 | A1 * | 6/2012 | Niimura | H01L 29/7395 257/329 |
| 2012/0273884 | A1 * | 11/2012 | Yedinak | H01L 29/0878 257/341 |
| 2013/0328104 | A1 * | 12/2013 | Jonishi | H01L 29/7393 257/139 |
| 2014/0118055 | A1 * | 5/2014 | Seok | H01L 23/495 327/432 |
| 2014/0367771 | A1 * | 12/2014 | Chatty | H01L 29/0623 257/329 |
| 2015/0380534 | A1 * | 12/2015 | Rahimo | H01L 29/7455 257/140 |

OTHER PUBLICATIONS

Jun Zeng and C. Frank Wheatley, *An Improved Power MOSFET Using a Novel Split Well Structure*, 1999 IEEE, 205-208 (4 pages).

Jun Zeng, C. Frank Wheatley, Rick Stokes, Chris Kocon, and Stan Benczkowski, *Optimization of the Body-Diode of Power MOSFETs for High Efficiency Synchronous Rectification*, ISPSD 2000, May 22-25, Toulouse, France (4 pages).

* cited by examiner

FIRST AND SECOND CHANNELS AND THE
ELECTRON INJECTION PORTION

ELECTRON FLOW AND INJECTION

TOP-DOWN VIEW OF THE GATE POLY
OF THE UNIT CELL

TOP-DOWN VIEW OF THE UNIT CELL
(WITH GATE POLY NOT SHOWN)

START WITH P++ WAFER, UPON WHICH AN N+ FIELD STOP LAYER IS DEPOSITED, AND UPON WHICH AN N- DRIFT LAYER IS DEPOSITED

LIGHT PHOSPHORUS IMPLANT

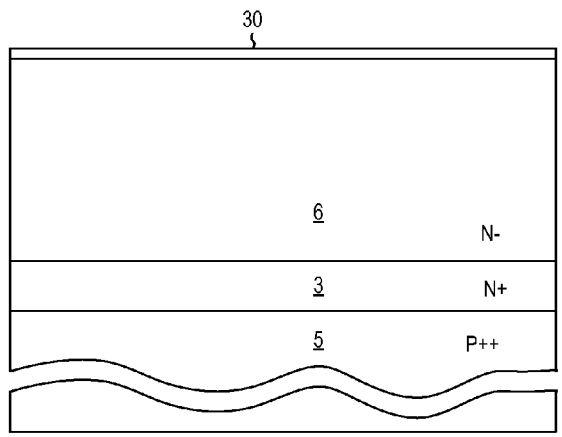
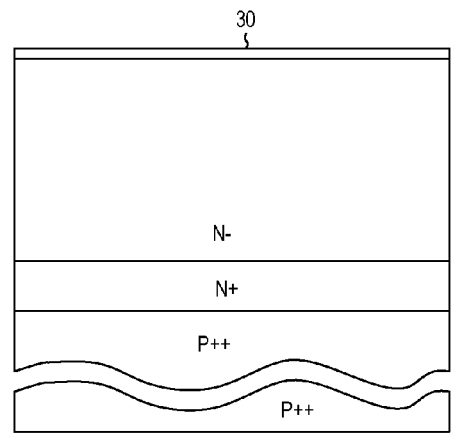
DRIVE IN, FORM SACRIFICIAL OXIDE, REMOVE
SACRIFICIAL OXIDE, FORM GATE OXIDE
FIG. 8A          FIG. 8B
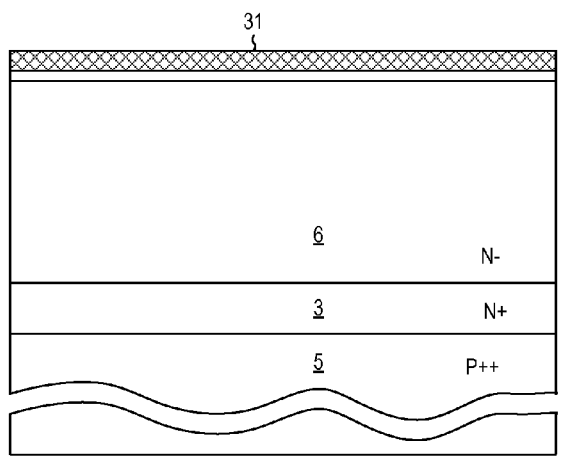
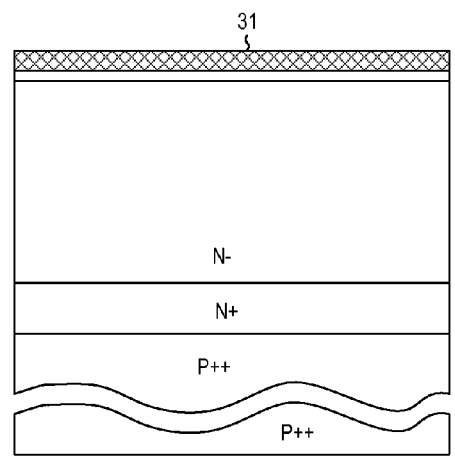
POLYSILICON DEPOSITION
FIG. 9A          FIG. 9B

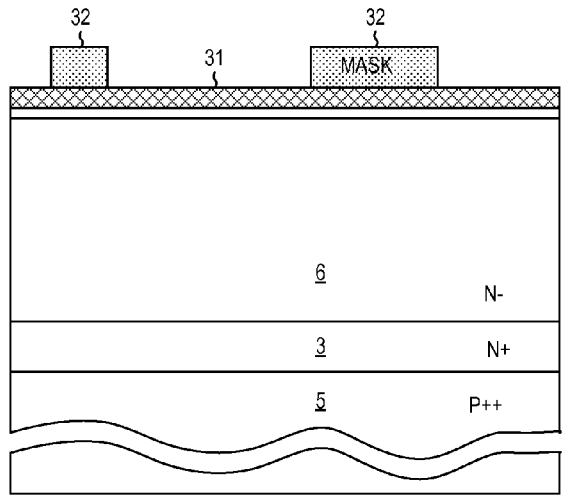 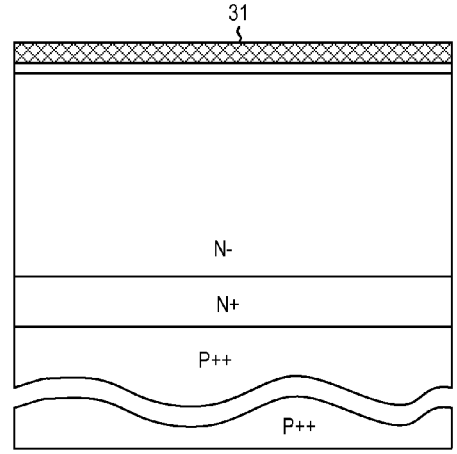
FIG. 10A    FIG. 10B
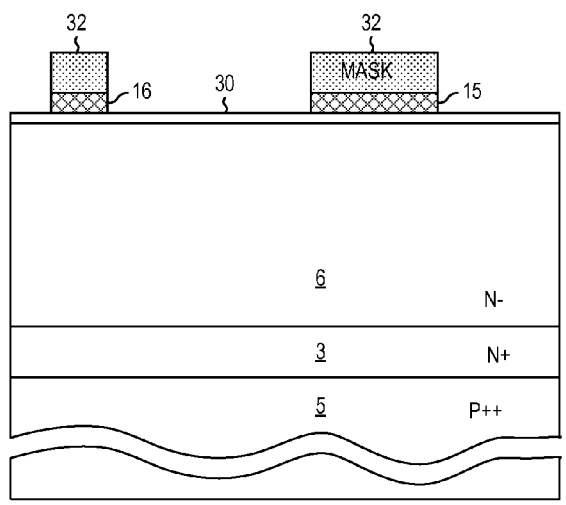 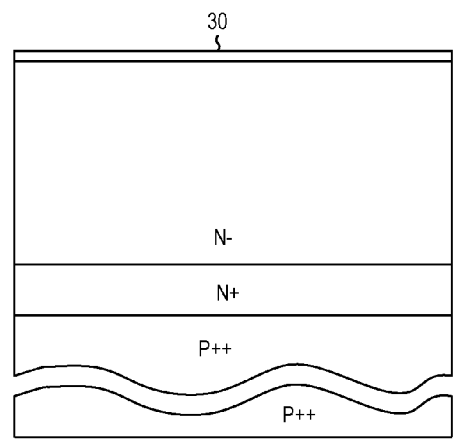
FIG. 11A    FIG. 11B

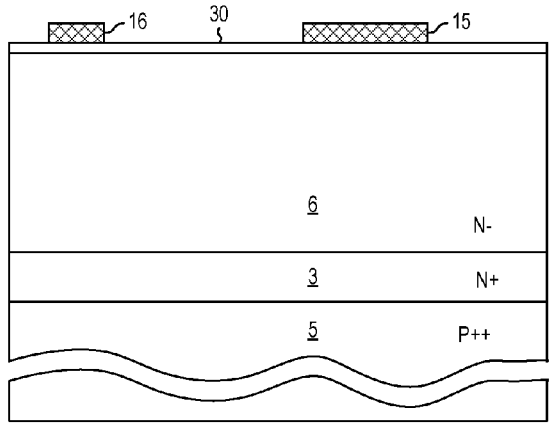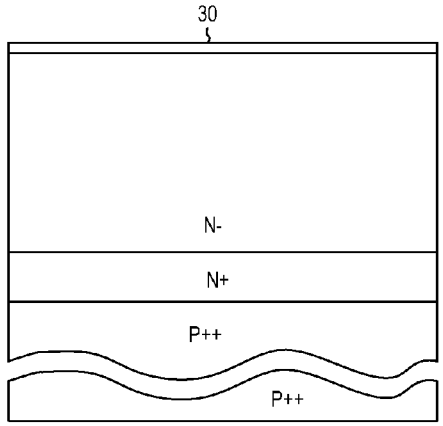
REMOVE POLY MASK
FIG. 12A   FIG. 12B
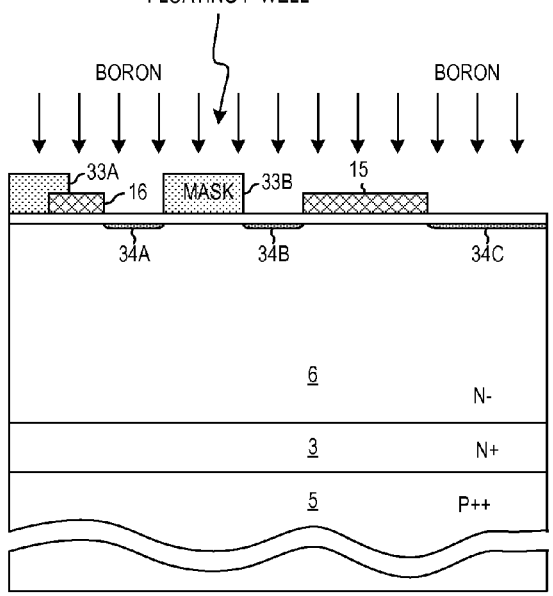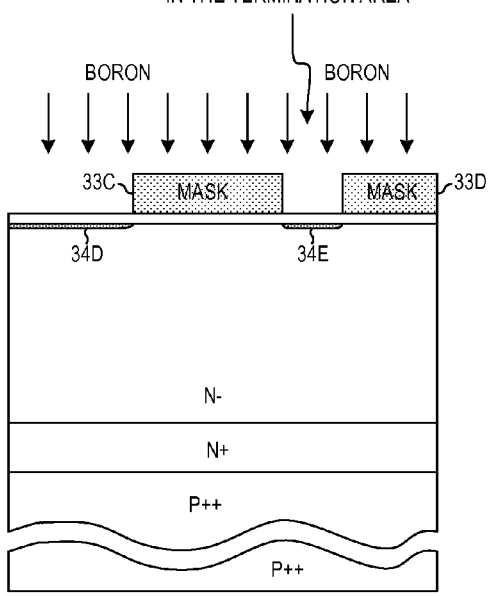
RING MASK, P WELL AND RING IMPLANT
FIG. 13A   FIG. 13B

REMOVE P WELL AND RING MASK,
FORM P+ MASK, P+ IMPLANT

REMOVE P+ MASK, P DRIVE IN
(TO FORM FLOATING P WELL, P BODY, TERMINATION RINGS)

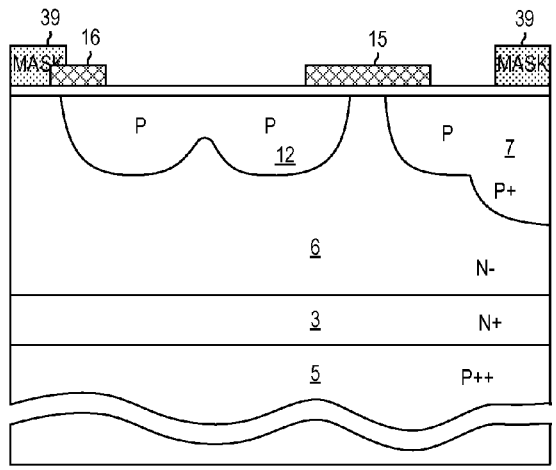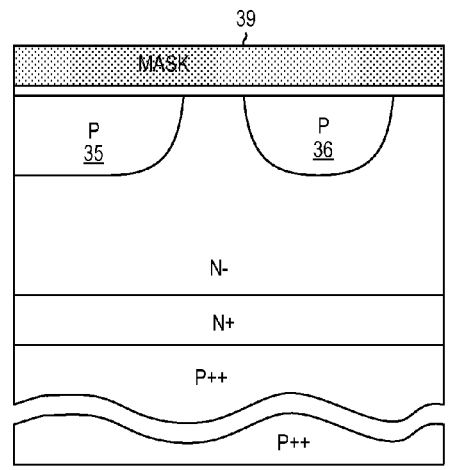
FIG. 16A      FIG. 16B
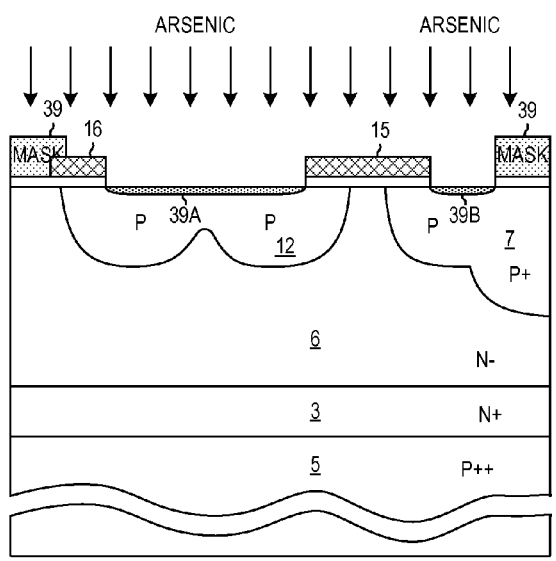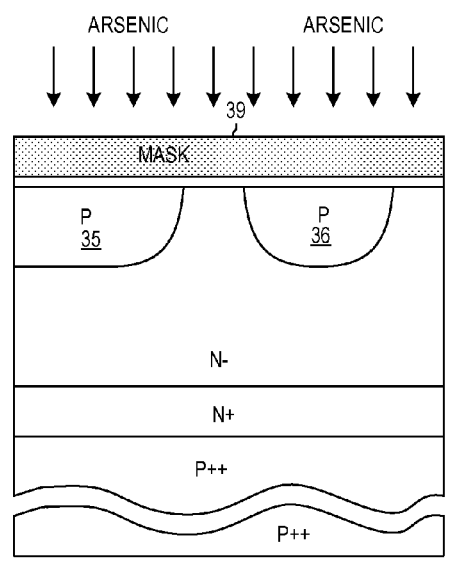
FIG. 17A      FIG. 17B

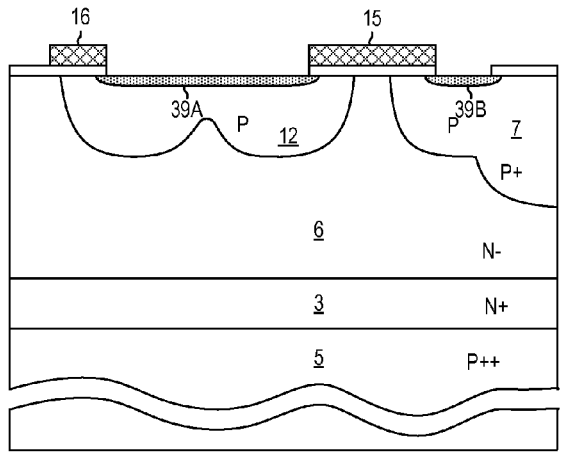
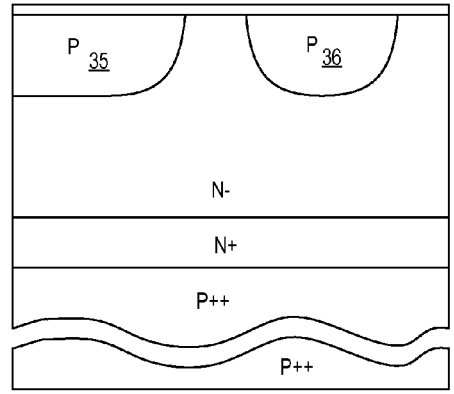
N+ MASK REMOVE
FIG. 18A
FIG. 18B
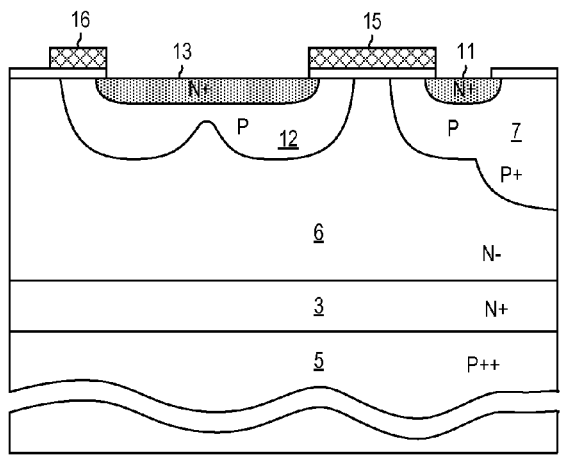
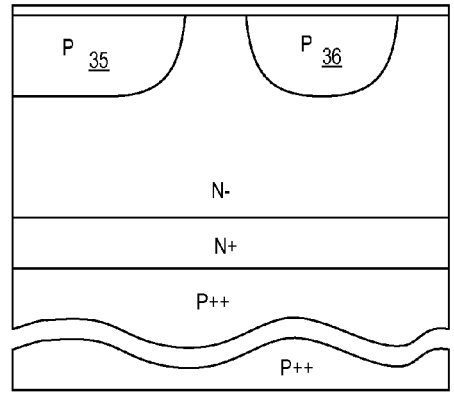
N+ DRIVE IN
FIG. 19A
FIG. 19B

ILD (INSULATION LAYER DEPOSITION),
REFLOW THE ILD LAYER

OXIDE MASK, OXIDE ETCH

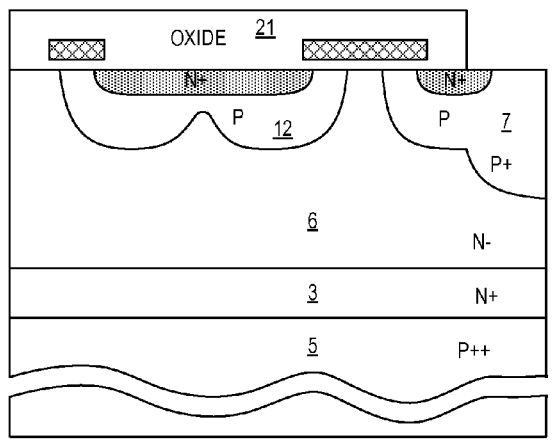
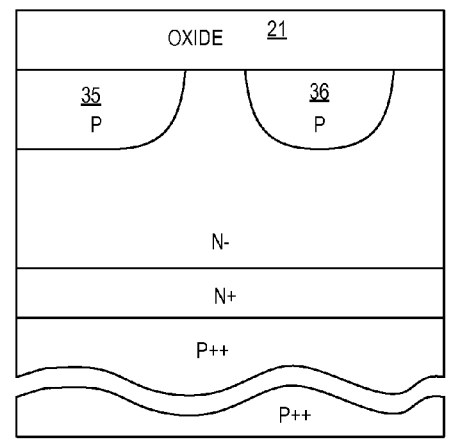
REMOVE OXIDE MASK
FIG. 22A　　　　　FIG. 22B
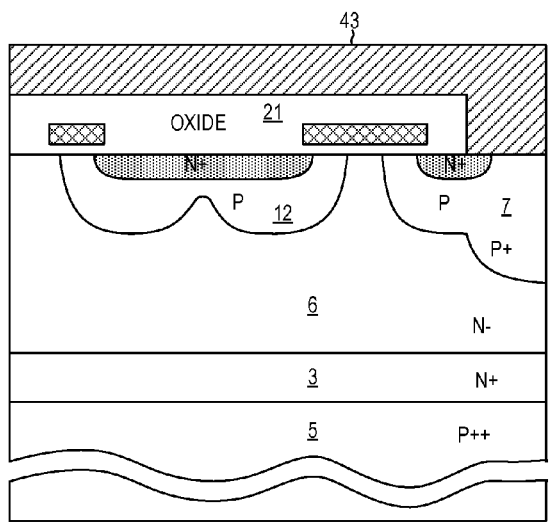
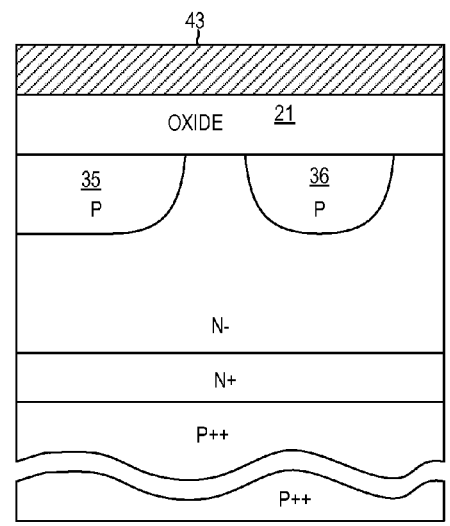
METALIZATION
FIG. 23A　　　　　FIG. 23B

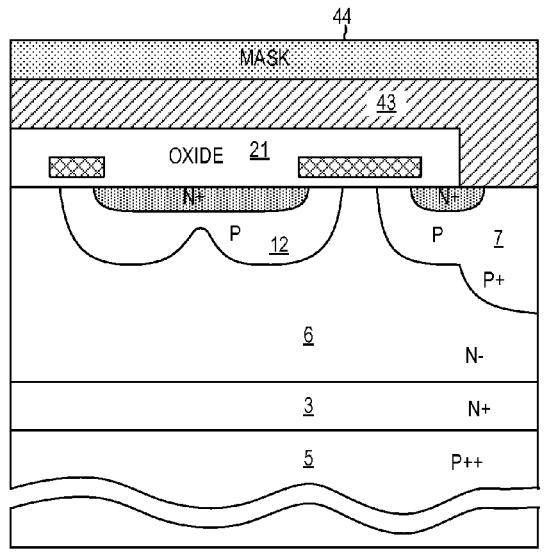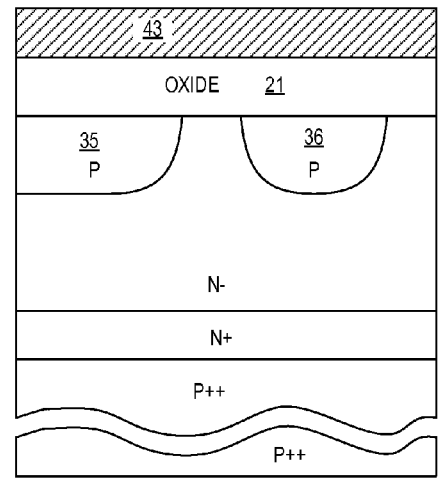
METAL MASK
FIG. 24A    FIG. 24B
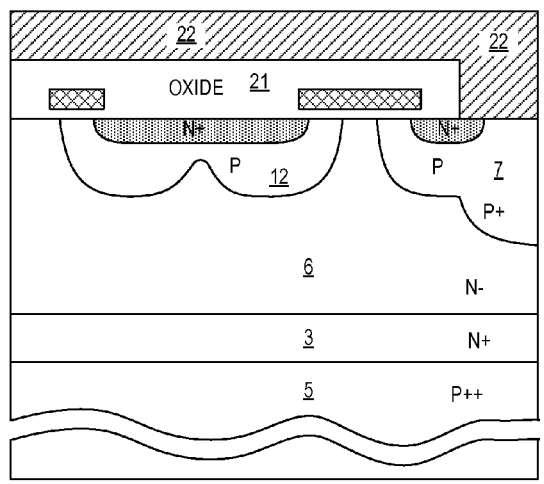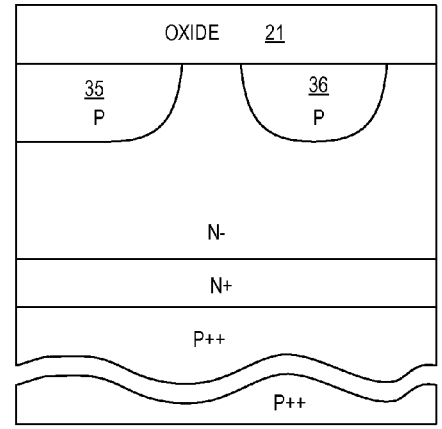
METAL ETCH
FIG. 25A    FIG. 25B

DEPOSIT NITRIDE PASSIVATION, PAD MASK,
NITRIDE ETCH, REMOVE NITRIDE MASK

BACKSIDE GRINDING TO THIN P++ SUBSTRATE

IGBT WITH WAVED FLOATING P-WELL ELECTRON INJECTION

TECHNICAL FIELD

The described embodiments relate to Insulated Gate Bipolar Transistors (IGBTs).

BACKGROUND INFORMATION

One type of Insulated Gate Bipolar Transistor (IGBT) involves an N+ type buffer layer or "field stop" layer disposed over a top layer of P type semiconductor substrate material. An N− type drift layer is disposed on the N+ type buffer layer. The N+ type buffer layer and the N− type drift layer may, for example, be epitaxially formed on the P type substrate. A P type body region is formed to extend down into the N− type drift layer from an upper semiconductor surface of the N− type drift layer. An N+ type emitter region extends from the surface down into the P type body region. A gate is disposed over a channel portion of the P type body region at the upper semiconductor surface. The channel portion is a surface portion of the P type body semiconductor material region that extends from the N+ type emitter region on one side to a portion of the N− type drift region at the other side. An emitter metal electrode is coupled to the N+ type emitter region and to the P type body region. A collector metal electrode is formed on the bottom surface of the P type substrate. A gate metal electrode on the top of the structure is coupled to the gate.

To turn on the IGBT device, a voltage on the gate induces inversion in the channel portion of the P type body region. A current flow in the form of electrons passes laterally from the N+ type emitter region, laterally through the channel portion, and to the N− type material of the N− type layer region at the semiconductor surface. From this surface region of the N− type drift layer, the path of electrons turns from lateral to vertical so that the electrons then pass vertically down through the N− type drift layer toward the P type collector layer. Some of the current carrying capacity of the device between the collector and emitter is due to this electron flow. In addition, holes are injected upward from the P type collector layer upward into the N+ buffer layer, and upward further into the N− drift layer. Another portion of the current carrying capacity of the device between the collector and emitter is therefore due to this hole flow. Because both holes and electrons are responsible for the current carrying capacity of the IGBT device, the device is a "bipolar" device.

As is understood in the art, increasing the concentration of charge carriers, both electrons and holes, in the N− type drift layer, and maintaining the proper balance and distribution of holes to electrons in the N− type drift layer, serves to reduce the collector-to-emitter saturation voltage $V_{CE\ (SAT)}$ of the IGBT device. The desired high concentration of charge carriers in the N− type drift layer is sometimes referred to as a "plasma" or an "electron/hole gas". It may be desirable, however, in a given structure to reduce the hole injection efficiency of the junction between the P type collector layer and the N+ type buffer layer. Alternatively, or in addition, it may be desirable to maintain a high concentration of holes in the N− drift layer by reducing the escape of holes from the N− type drift layer into the P type body region. In one example, some of the cells at the upper surface of the IGBT are made to be so-called floating "dummy cells". The floating P bodies of these cells are not coupled to the emitter electrode. Another top-side structure that can be employed to reduce the escape of holes is a floating P type well or layer. Such a floating P type well is an amount of floating P type semiconductor material at the upper semiconductor surface. Due to the inclusion of such floating P type well structures in the upper part of the IGBT, the overall proportion of hole absorbing P type body material at the upper part of the IGBT device is reduced. With such a floating P type well, electron injection in the upper part of the IGBT is adequate, but the absorption of holes out of the N− drift region is reduced because the proportion of the upper part of the IGBT that is hole absorbing P type body material is reduced. As a result, the rate of hole escape from the N− drift region is reduced and the hole concentration in the N− drift region during device on time is increased. Accordingly, the resistivity of the N− type drift layer is reduced and the voltage drop across the drift layer when the device is on is reduced.

In addition to IGBTs, there are other devices such as so-called MOS-Controlled Thyristor (MCT) devices and so-called Emitter Switched Thyristor (EST) devices. There are several variations of each of these devices, including dual channel EST devices. In one exemplary device considered here, a floating N+ type region is disposed at the upper semiconductor surface of the device so that this floating N+ type region extends into a floating P type region. The floating P type region extends into the upper surface of an N− type layer. The N− type layer is in turn disposed over a P type substrate layer. A vertically disposed NPN bipolar transistor structure therefore exists. The floating N+ type layer serves as the emitter. The floating P type region serves as the base. The N− type semiconductor material immediately beneath the floating P type region serves as the collector. In addition, a lateral field effect transistor structure is disposed at the top of the device to the side of the floating structures. When the device is to be turned on, a voltage on the gate of the lateral field effect transistor induces inversion in a channel region of the lateral field effect transistor. Electrons flow laterally through the channel, and then flow further laterally into the floating N+ type region and also into the floating P type region. This current into the floating structures causes the NPN bipolar transistor to turn on. As a result, the NPN bipolar transistor injects electrons downward into the N− type layer. A second bipolar transistor, which is a PNP bipolar transistor, is disposed on the bottom of the device. The NPN bipolar transistor and the PNP bipolar transistor are interconnected in such a way that they are referred to as a thyristor. The floating P type region serves at the collector of this second PNP transistor. The N− type layer beneath the P type region serves as the base of this second PNP transistor. The P type substrate serves as the emitter of this second PNP transistor. In the case of an MCT device, once both bipolar transistors turn on, they create a latch up condition such that the gate has no further control on the collector-to-emitter current. This is proper for thyristor operation, but is unacceptable in an IGBT.

An improved IGBT structure and device is desired that has a high concentration of electrons and holes its drift region during its on state, but yet turns off fast and does not suffer latchup and other problems.

SUMMARY

A planar IGBT die structure has a P type body region and an N+ type emitter region that extends down into the P type body region from an upper semiconductor surface. The IGBT die structure also has a novel floating P type well region, and a novel floating N+ type well region that extends down into the floating P type well region from the upper semiconductor surface. These novel floating well structures are laterally displaced with respect to the P type body region when a unit cell of the IGBT is considered from a cross-sectional perspective. A gate of the IGBT has a first portion and a second portion. The first portion of the gate is disposed over a first channel region. The first channel region extends laterally all the way from the N+ type emitter region of the IBGT to the floating N+ type well region. The second portion of the gate is disposed over a second channel region. The second channel region extends laterally between the floating N+ type well region and an electron injector portion of the N− type drift layer of the IGBT.

In a novel aspect, the bottom interface between the floating P type well region and the underlying N− type drift layer has a waved contour. As a result of the waved contour, the floating P type well region has thinner portions and thicker portions. In an on state of the IGBT, electrons flow from the N+ type emitter and flow laterally across the first channel region. Some electrons at this point pass downward deeper into the N-type drift layer toward the bottom of the IGBT as is conventional. Other electrons, however, pass laterally into the floating N+ type well region, pass laterally through the floating N+ type well region, and to a local bipolar transistor. The local bipolar transistor is located at a thinner portion of the floating P type well. Some electrons are injected by this local bipolar transistor vertically down into the N− type drift layer. Other electrons, however, pass laterally farther through the floating N+ type well region to the second channel region, and then pass laterally through the second channel region, and to the electron injector portion of the N− type drift layer. From the electron injector portion, these electrons pass vertically downward through the N− type drift layer toward the bottom of the IGBT device. The injection of additional electrons, due to the local bipolar transistor and due to the second channel region and the electron injector portion, promotes a desirable high concentration and a more uniform distribution of charge carriers in the N− type drift layer. The floating well structures can be tailored to cause a good distribution of such carriers in the N− type drift layer. As a result, the novel floating well structures promote a low $V_{CE(SAT)}$ for the IGBT when the device is on.

In the IGBT off state, the first and second channels are off. The sidewall of the floating P type well region that is closest to the P type body of the IGBT is one of the thicker parts of the floating P type well region. This thickness results in the IBGT having a higher reverse breakdown withstand voltage than it would have otherwise were the floating P type well region thinner at this sidewall location. In some embodiments, the IGBT has an N+ type buffer layer disposed between the IGBT's P++ type collector layer and the IGBT's N− type drift layer. The waved floating well structure is usable in both punch-through IGBTs (PT-IGBT) and non-punch-through IGBTs (NPT-IGBT).

In another novel aspect, a method of making an IGBT involves making the waved bottom contour of a floating P type well region using the same ring mask that is used to make floating rings in the edge termination area of the IGBT. Due to the additional use of this ring mask that is used in the manufacturing process any way, no additional masking step is required in order to make the waved bottom contour of the novel IGBT as compared to manufacturing an otherwise identical IBGT having a floating P type well with a planar bottom surface. In one aspect, the depth of the thinner portions of the floating P type well region is set by setting the spacing between P type dopant implant regions when the floating P type well region is implanted. The number of thinner regions, and the spacing between adjacent thinner regions, is also readily adjusted and set by modification of just the ring mask layer, without changing anything else in the remainder of the semiconductor manufacturing process used to make the IGBT. Various different embodiments of IGBT unit cells are disclosed that have different geometries of floating P type wells, different numbers of floating P type wells, different geometries and numbers of electron injectors, different geometries and numbers of thinner versus thicker portions of the floating P type well regions, and different geometries and numbers of surrounding N+ type emitter regions. A floating P type well region of a unit cell may have multiple thinner portions, where the spacing between one adjacent pair of thinner portions is different than the spacing between another adjacent pair of thinner portions.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 8A and 8B are cross-sectional diagrams that illustrate a third step in the method of manufacturing the IGBT die structure of FIG. 1.

FIGS. 9A and 9B are cross-sectional diagrams that illustrate a fourth step in the method of manufacturing the IGBT die structure of FIG. 1.

FIGS. 10A and 10B are cross-sectional diagrams that illustrate a fifth step in the method of manufacturing the IGBT die structure of FIG. 1.

FIGS. 11A and 11B are cross-sectional diagrams that illustrate a sixth step in the method of manufacturing the IGBT die structure of FIG. 1.

FIGS. 12A and 12B are cross-sectional diagrams that illustrate a seventh step in the method of manufacturing the IGBT die structure of FIG. 1.

FIGS. 13A and 13B are cross-sectional diagrams that illustrate an eighth step in the method of manufacturing the IGBT die structure of FIG. 1.

FIGS. 16A and 16B are cross-sectional diagrams that illustrate an eleventh step in the method of manufacturing the IGBT die structure of FIG. 1.

FIGS. 17A and 17B are cross-sectional diagrams that illustrate a twelfth step in the method of manufacturing the IGBT die structure of FIG. 1.

FIGS. 18A and 18B are cross-sectional diagrams that illustrate a thirteenth step in the method of manufacturing the IGBT die structure of FIG. 1.

FIGS. 19A and 19B are cross-sectional diagrams that illustrate a fourteenth step in the method of manufacturing the IGBT die structure of FIG. 1.

FIGS. 22A and 22B are cross-sectional diagrams that illustrate a seventeenth step in the method of manufacturing the IGBT die structure of FIG. 1.

FIGS. 23A and 23B are cross-sectional diagrams that illustrate an eighteenth step in the method of manufacturing the IGBT die structure of FIG. 1.

FIGS. 24A and 24B are cross-sectional diagrams that illustrate a nineteenth step in the method of manufacturing the IGBT die structure of FIG. 1.

FIGS. 25A and 25B are cross-sectional diagrams that illustrate a twentieth step in the method of manufacturing the IGBT die structure of FIG. 1.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "upper", "top", "up", "down", "vertically", "laterally", "lower", "bottom", and "backside" are used herein to describe relative orientations between different parts of the structure being described, and it is to be understood that the overall structure being described can actually be oriented in any way in three-dimensional space. The notations N+, N−, N, P++, P+, and P are only relative, and are to be considered in context, and do not denote any particular dopant concentration range. A region denoted generally in the claims to be "P type", however, is being indicated to be P type doped, and may be lightly doped, moderately doped, or heavily doped with P type dopants. Similarly, a region denoted in the claims to be N type is being indicated to be N type doped, and may be lightly doped, moderately doped, or heavily doped with N type dopants.

Figure 1:
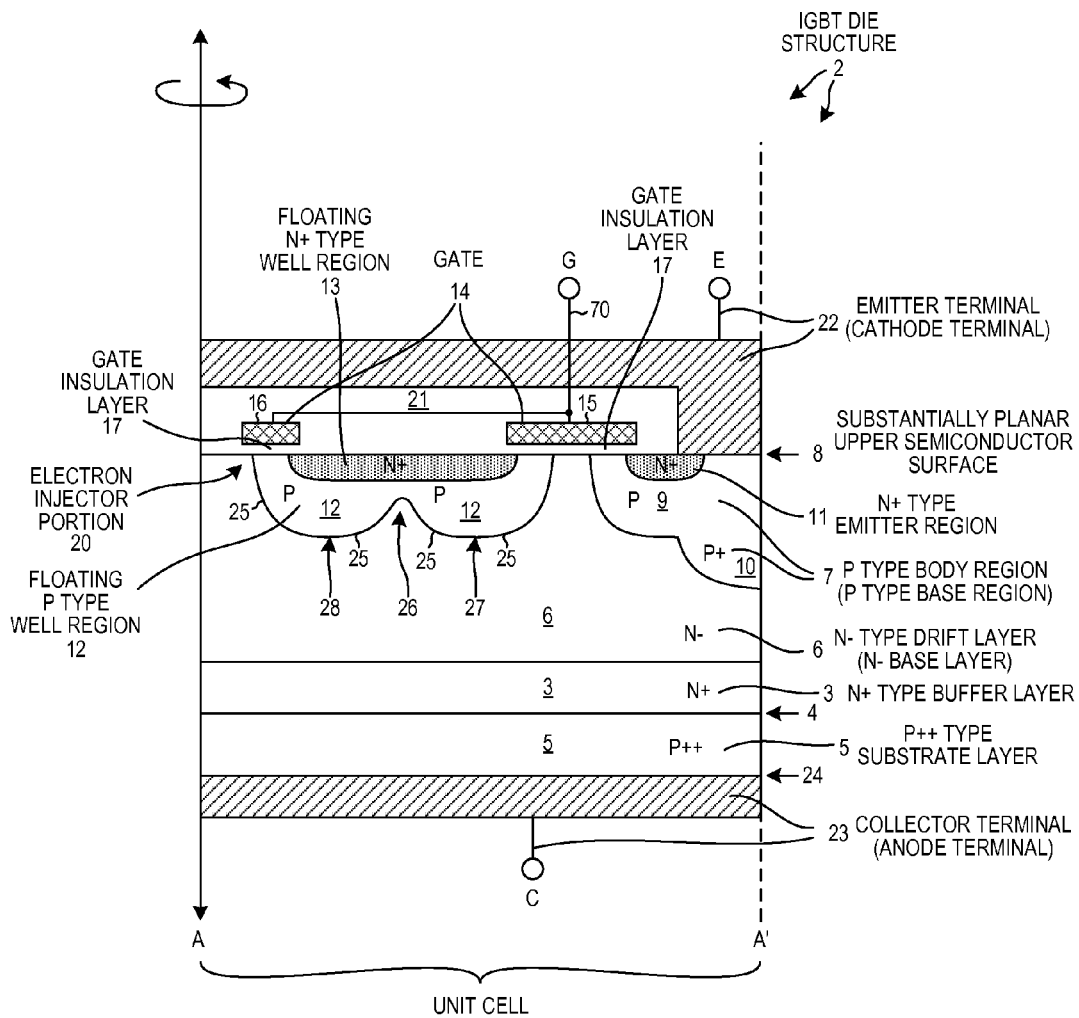
FIG. 1 is a cross-sectional diagram of a unit cell of an IGBT die structure in accordance with one novel aspect.

FIG. 1 is a cross-sectional diagram of a unit cell 1 of an IGBT die structure 2. The cross-sectional view of FIG. 1 is taken along sectional line A'-A in the top-down diagram of FIG. 4. The line labeled A at the left of FIG. 1 corresponds to a central location A in the unit cell structure of FIG. 4. An N+ type buffer layer (also called a "field stop" layer) 3 is disposed over the top major surface 4 of a P++ type semiconductor substrate layer 5. An N− drift layer 6 is in turn disposed over the N+ type buffer layer 3. In one example, the three layers 5, 3 and 6 are formed starting with a P++ type silicon wafer, upon which the N+ type buffer layer 3 and N− type drift layer 6 are formed by epitaxial deposition. A P type body region 7 is formed to extend down into the N− type drift layer 6 from a substantially planar upper semiconductor surface 8. The P type body region 7 has a relatively lighter doped P type portion 9 and a relatively heavily doped P+ type portion 10. An N+ type emitter region 11 is formed to extend from the substantially planar upper semiconductor surface 8 down into the P type body region 7. In addition, a floating P type well layer or region 12 is formed to extend from the substantially planar upper semiconductor surface 8 down into the N− drift layer 6 such that the floating P type well 12 is laterally separated from the P type body region 7 by an amount of N− type semiconductor material as illustrated. In addition, a floating N+ type well region or layer 13 is formed to extend down into the floating P type well 12 from the upper semiconductor surface 8 as illustrated. In the case of the example of FIG. 1, which is seen from the top-down perspective in FIG. 5, the N+ type floating well region 13 actually involves four N+ type regions as seen in FIG. 5. A polysilicon gate structure 14 has a first portion 15 and a second portion 16, as the gate is seen in the particular cross-sectional view of FIG. 1. The gate is separated from the substantially planar upper semiconductor surface 8 by a thin gate oxide layer 17.

The first portion 15 of the gate extends over a first channel region 18. The first channel region 18 is an amount of semiconductor material disposed at the upper surface 8 that extends under the gate between the left edge of N+ type emitter region 11 in the diagram of FIG. 1 and the right edge of the floating N+ type well region 13 in the diagram of FIG. 1. The first portion 15 of the gate is disposed so that a voltage on the gate can cause P type semiconductor material of the P type body region 7 at the semiconductor surface 8 to invert, and can cause an accumulation layer to form at the surface of the N− type semiconductor material between the P type body region 7 and the floating P type well region 12, and can cause P type semiconductor material of the floating P type well 12 to invert. By inducing these effects, the gate can make the first channel region conductive all the way from the N+ type emitter region 11 to the floating N+ type well region 13. In the particular cross-sectional view of FIG. 1, the first channel region 18 extends all the way from the left side of the N+ type emitter region 11, laterally under the gate to the left, and to the right side of the floating N+ type region 13.

In addition to this first portion of the gate, there is the second portion 16 of the gate. The second portion 16 of the gate extends over a second channel region 19 of underlying P type semiconductor material. The second channel region 19 is an amount of P type semiconductor material of the floating P type well region 12 that extends at the semiconductor surface 8 laterally between the N+ type emitter region(s) 13 and an electron injector portion 20 of N type semiconductor material. In the illustrated example, the N type semiconductor material of the electron injector portion 20 is an amount of the N− type drift layer 6 that extends up to the substantially planar upper semiconductor surface 8. The second portion 16 of the gate is disposed so that a voltage on the gate can cause the second channel region 19 of P type semiconductor material of the floating P type well region 12 to invert. By this inversion, the gate makes the second channel region conductive.

The IGBT die structure 2 of FIG. 1 further includes an oxide layer 21 that covers the gate. A first metal electrode and terminal 22 (the emitter terminal) is disposed over the oxide 21 and is coupled both to the N+ type emitter region 11 and to the P type body region 7. A second metal electrode and terminal 70 (the gate terminal) is disposed over oxide 21 and is coupled to the gate 14. The second metal electrode 70 and terminal is not present in the cross-section of FIG. 1 and therefore it is not pictured but rather it is represented by a terminal symbol. A third metal electrode and terminal 23 (the collector terminal) is formed on the bottom major surface 24 of the P++ type substrate layer 5.

Figure 2:
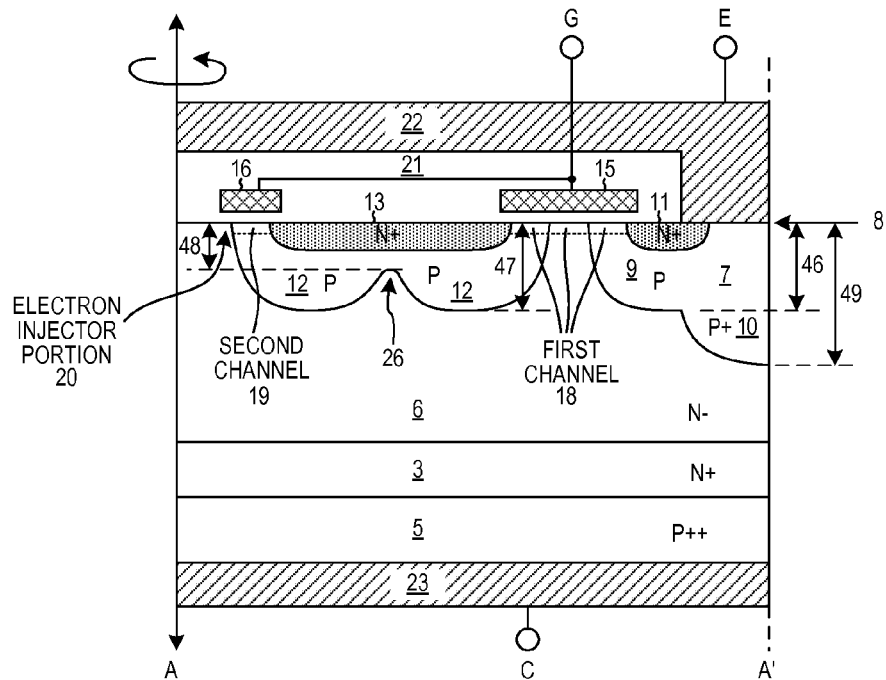
FIG. 2 is a cross-sectional diagram that points out the first channel region and the second channel region in the IGBT die structure of FIG. 1.

FIG. 2 is a cross-sectional diagram that illustrates the first channel region 18 and the second channel region 19. The IGBT device is turned on by placing an appropriate positive voltage on the gate 14, thereby making the first and second channel regions conductive. In conventional IGBT fashion, electrons flow from the N+ type emitter region 11, laterally through the first channel region in the P type body region 7, and to the N type semiconductor material at the lateral edge of the P type body region, and from there the electrons turn and pass vertically downward deeper into the N− type drift layer 6. This is the standard electron flow path in a planar IGBT of this type. In addition, in conventional IGBT fashion, the PN junction between the P+ type collector layer 5 and the N+ type buffer layer 3 injects holes upward, and the holes pass up into the N− type drift layer 6. A high concentration of electrons and holes in the N− drift layer 6 forms. This high concentration of electrons and holes is referred to as a plasma or as an electron/hole gas. Overall, a collector-to-emitter current in the on state of the IGBT flows from the collector electrode 23, vertically up through the device, and to the emitter electrode 22.

Figure 3:
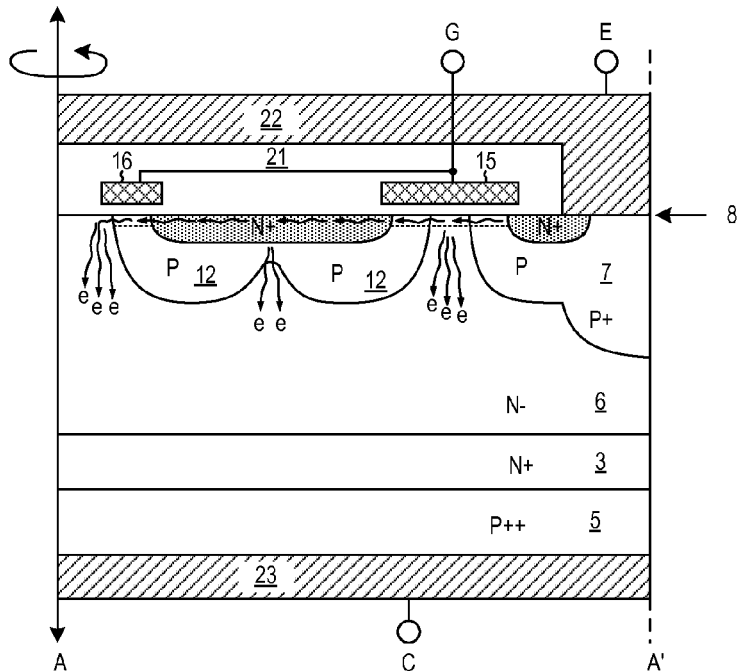
FIG. 3 is a cross-sectional diagram that illustrates electron injection from a local NPN bipolar transistor of a floating well structure of the IGBT die structure of FIG. 1, and electron injection from a second channel of the floating well structure of the IGBT die structure of FIG. 1.

In addition to this conventional IGBT operation, the second portion 16 of the gate causes the second channel region 19 to be conductive. As illustrated in FIG. 3, some electrons from the N+ type emitter region 11 pass laterally from the N+ type emitter region 11, laterally through the first channel 18 under the first portion 15 of the gate to the floating N+ type region 13. The term "channel" here is used in connection with the term "first channel" 18 in a loose sense to refer to the combination of a first inversion region in P type body region 9, an accumulation region through the N− type layer 6, and a second inversion region in the floating P type well region 12, where these three regions are oriented as shown in FIG. 2 so that electrons can flow laterally from the left edge of N+ type emitter region 11, through the so-called first channel 18, and to the right edge of floating N+ type well region 13. From the right edge of the floating N+ type well 13, the electrons flow laterally further across the low resistance floating N+ type region 13, and then laterally through the second channel region 19, and to the electron injector portion 20. From the electron injector portion 20 the electrons turn and pass vertically downward deeper into the N− type drift layer 6 and toward the P type collector layer 5. The structure of the second portion 16 of the gate, and the underlying P type semiconductor material that can invert, is referred to here as an "electron-injecting floating field effect transistor". This electron-injecting floating field effect transistor, in the on state of the overall IGBT, serves to inject additional electrons into the N− type drift region 6 as compared to the same structure without the floating field effect transistor, thereby increasing the concentration of electrons in the electron/hole gas in the on state of the IGBT. In the illustrated example, the second portion 16 of the gate does not extends all the way to the left to the center of the unit cell (does not extend all the way to the left edge of the diagram of FIG. 2), but rather just barely covers the second channel region 19 and does not cover all of the electron injector portion 20 to its left. The minimized size of the second portion 16 of the gate helps reduce gate capacitance.

In addition to the electron-injecting floating field effect transistor, the floating P type well and floating N+ type well structures also involve a local electron-injecting NPN bipolar structure. The floating P type well region 12 has a waved bottom interface 25 with the underlying N− type drift layer 6. Due to the waved form of this interface 25, the floating P type well region has a thinner portion 26 and a plurality of thicker portions 27 and 28. The thinner portion 26 of the floating P type well region 12 is less than half as thick as the thicker portions 27 and 28. In the specific example of FIG. 1, the depth of the floating N+ well region 13 and of the N+ type emitter region 11 is 0.3 microns, the depth 48 of the thinner portion 26 of the floating P type well region 12 is 0.5 microns, and the depth 47 of the thicker portions 27 and 28 of the floating P type well region 12 is 2.5 microns, and the depth 49 of the deeper P+ type portion 10 of the P type body region 7 is 3.5 microns. At the location of the thinner portion 26, a local electron-injecting NPN bipolar transistor structure is formed, with a local portion of the floating N+ type well 13 being the emitter, with the thin portion 26 of the floating P type well region 12 being the base, and with N− type semiconductor material of the N− type drift region 6 being the collector. Due to electrons flowing into the floating well structures 13 and 12, this local electron-injecting NPN bipolar transistor structure is turned on. As a result, electrons are locally injected down into the N− type drift region 6 from the area of thinner portion 26. There is such electron injection from all thinner areas of the floating P type well. Although only one such thinner area 26 is shown in the particular cross-sectional view of FIG. 3, the illustration of FIG. 3 is a simplification made for illustration purposes. In a real device, the cross-sectional view of FIG. 3 would typically include several thinner and several thicker regions oriented so that there are several local electron-injecting bipolar transistors disposed in the plane of FIG. 3 along a single line of electron flow between the first channel region 18 and the second channel region 19.

In the off state of the IGBT structure, there may be a high reverse voltage present across the device between the collector and the emitter. The floating P type well region 12 is made thicker where it is adjacent the first channel region 18 and the P type body region 7. The depth 46 of the floating P type well region at this location adjacent the first channel region is the substantially the same as the depth 47 of the lighter P type doped portion 9 of the P type body region 7. Due to the floating P type well region 12 being deep in these areas adjacent to the first channel region 18, the curvature of the electric field under high reverse voltages in the IGBT off state is relaxed. The less-sharp curvature of the electric field at the sides of the heavily P+ type doped portion of the P type body region 7 serves to increase the reverse voltage at which the IGBT suffers reverse breakdown.

Figure 4:
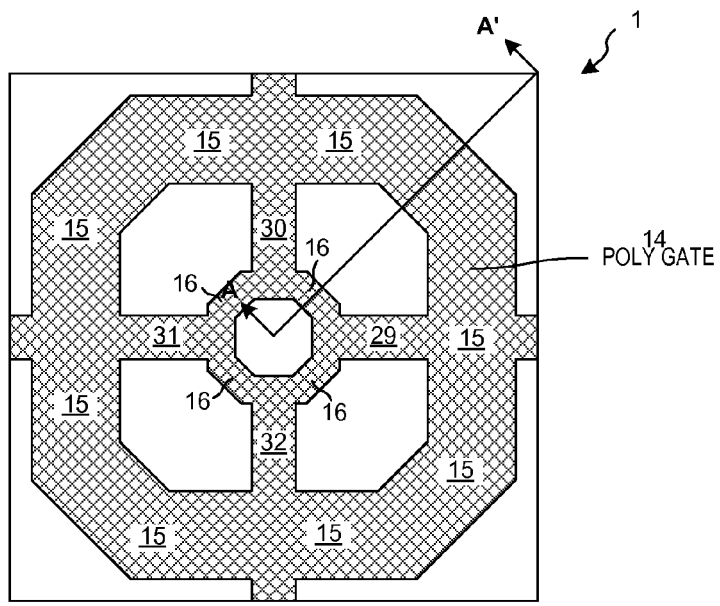
FIG. 4 is a top-down diagram of the unit cell of the IGBT die structure of FIG. 1, showing the gate structure.
Figure 5:
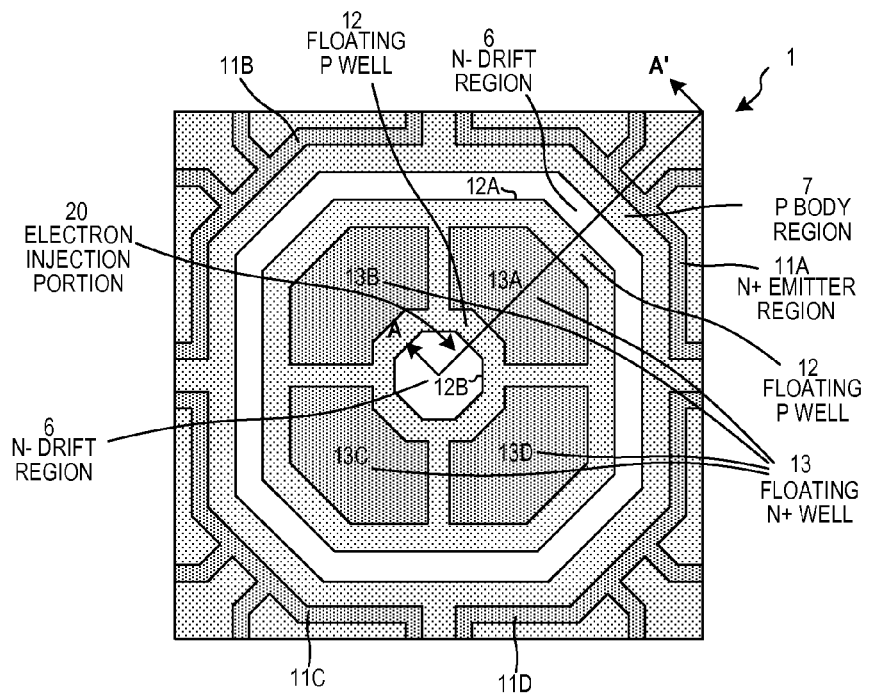
FIG. 5 is a top-down diagram of the unit cell of the IGBT die structure of FIG. 1, showing other parts of the unit cell other than the gate structure.

FIG. 4 is a top-down diagram of the gate structure of a unit cell 1 of the IGBT die structure of FIG. 1. The other layers and regions of the unit cell are not shown in FIG. 4. The boundary of the unit cell 1, when considered from the top-down perspective, is a square. The first portion 15 of the gate is the outer octagonal ring of a larger width and the second portion 16 of the gate is the inner octagonal ring of a smaller width. The two portions of the gate are joined by bridges 29-32. The entire gate structure is a patterned layer of polysilicon.

FIG. 5 is a top-down diagram of the unit cell 1, but in this diagram the structures of the unit cell at the semiconductor surface are shown, without the gate obscuring them. Note that from the top-down perspective of the diagram, there are actually four N+ type emitter regions 11A, 11B, 11C and 11D that together form an octagon. These N+ type emitter regions substantially ring and surround the floating P type well region 12 and the floating N+ type well region 13. In this way, there may be multiple N+ type emitter regions that align with one another end-to-end to form such a ringed structure that surrounds the floating P and N+ type well regions, or alternatively there may be a single N+ type emitter region that by itself rings and surrounds the floating P and N+ type well regions. When the IGBT unit cell is considered from the top-down perspective, the electron injector portion 20 is an octagonal ring that is centrally located in the unit cell. The octagonal ring of the electron injector portion 20 extends along the inside edge of the central octagonal hole in the floating P type well region 12. The floating P type well region 12 has the shape of a thin washer, or donut. The outer octagonal periphery of the floating P type well region is identified by reference numeral 12A. The inner octagonal periphery of the floating P type well region is identified by reference numeral 12B. The floating N+ type well region 13 is of the same general shape as the floating P type well region 12, only its outer periphery is less wide than the outer periphery of the floating P type well region, and its inner periphery is wider than the inner periphery of the floating P type well region 12. The floating N+ type well region 13 actually involves four separate regions 13A, 13B, 13C and 13D in this example. The floating N+ type well region 13 is thinner in depth as compared to the thicker floating P type well region 12, as shown in FIG. 1. The first channel region 18 is actually a ring that extends around the outer periphery of the floating N+ type well region. The first channel region 18, as the term is used here, extends outward from the outer periphery of the floating N+ type well region 13 to the inside periphery of the octagon formed by the N+ type emitter regions. The second channel region 19 is actually also a ring. The second channel region 19 extends around the inner octagonal periphery of the floating N+ type well region 13.

Figures 6A, 6B:
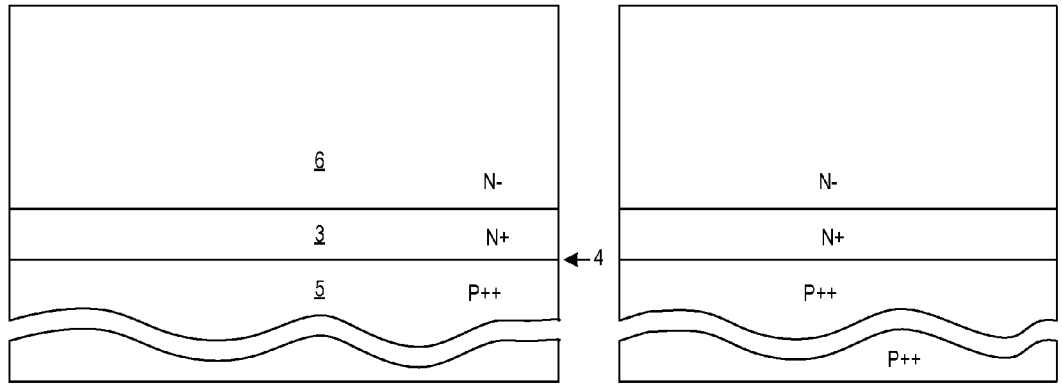
FIGS. 6A and 6B are cross-sectional diagrams that illustrate a first step in a method of manufacturing the IGBT die structure of FIG. 1.
Figures 7A, 7B:
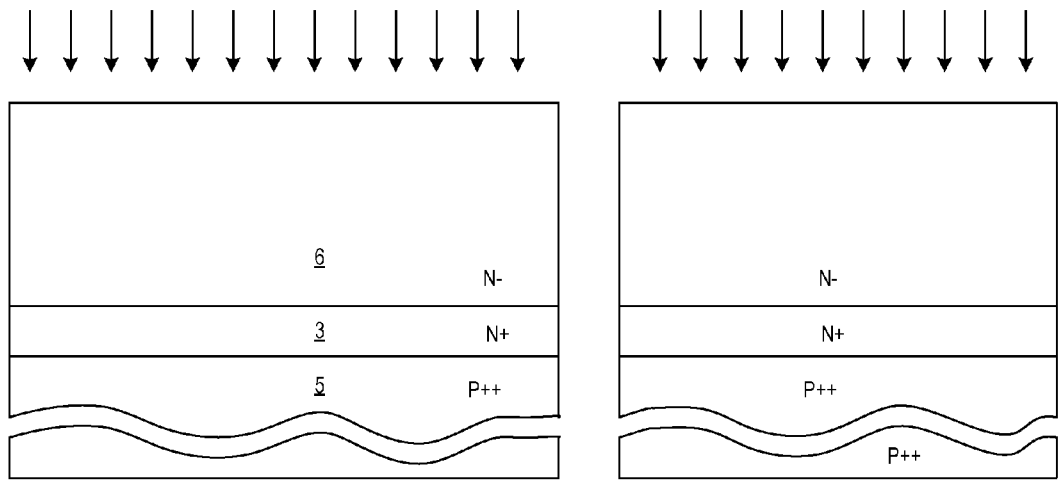
FIGS. 7A and 7B are cross-sectional diagrams that illustrate a second step in the method of manufacturing the IGBT die structure of FIG. 1.
Figure 14A:
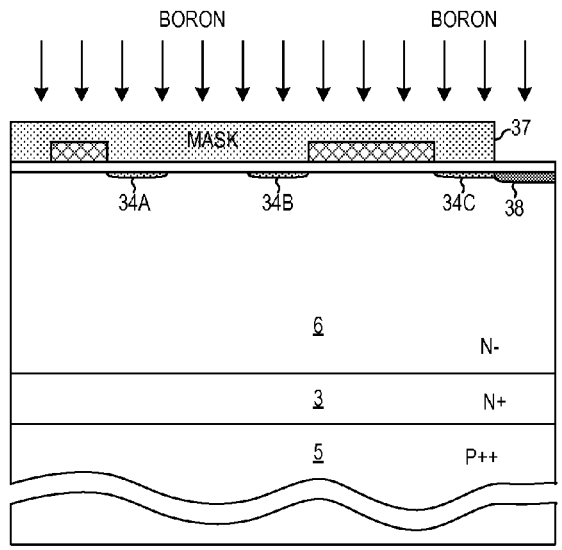
FIGS. 14A and 14B are cross-sectional diagrams that illustrate a ninth step in the method of manufacturing the IGBT die structure of FIG. 1.
Figure 14B:
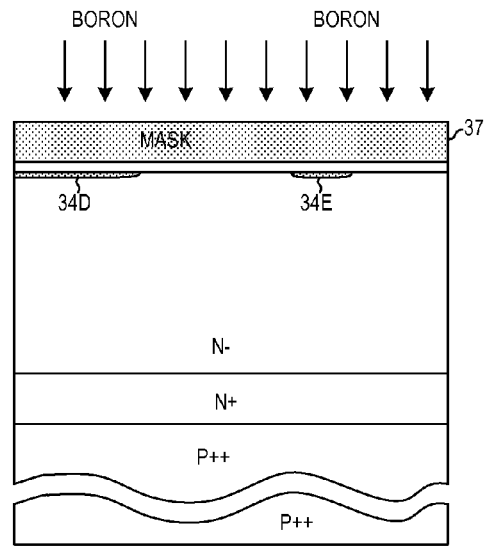
Figure 15A:
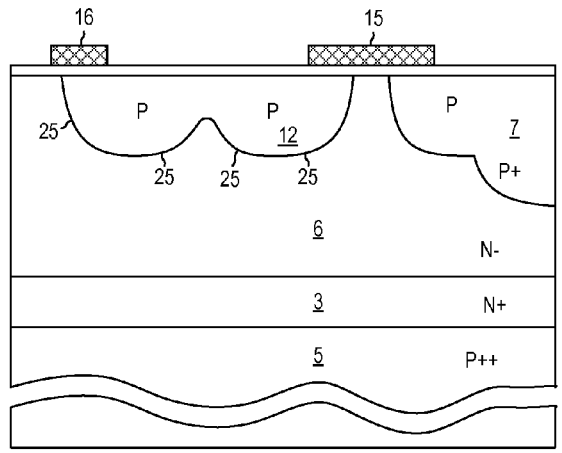
FIGS. 15A and 15B are cross-sectional diagrams that illustrate a tenth step in the method of manufacturing the IGBT die structure of FIG. 1.
Figure 15B:
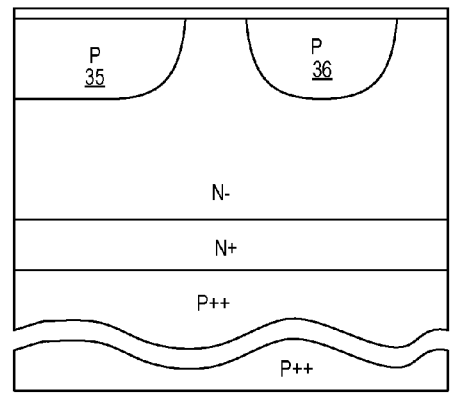
Figure 20A:
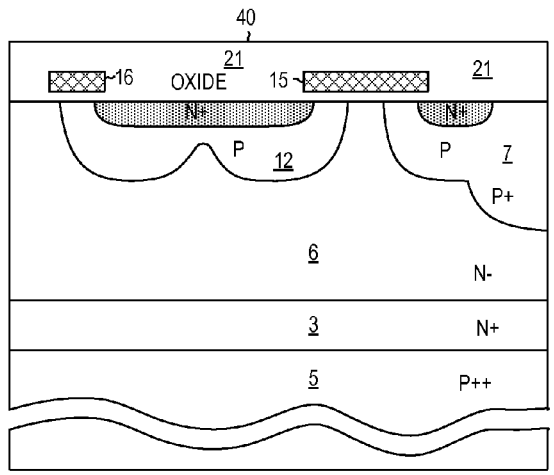
FIGS. 20A and 20B are cross-sectional diagrams that illustrate a fifteenth step in the method of manufacturing the IGBT die structure of FIG. 1.
Figure 20B:
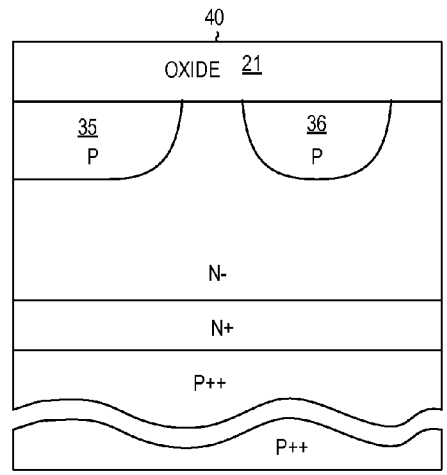
Figure 21A:
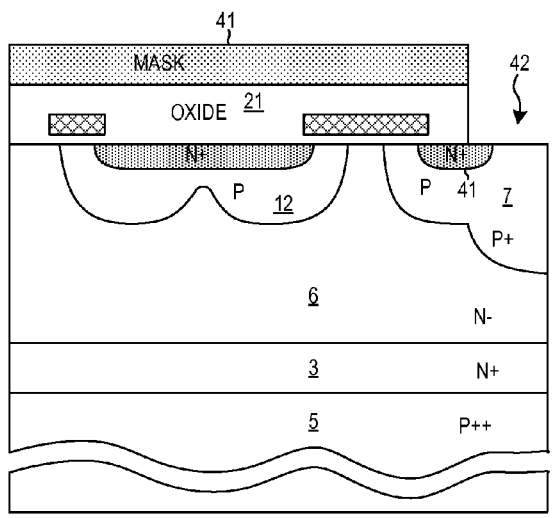
FIGS. 21A and 21B are cross-sectional diagrams that illustrate a sixteenth step in the method of manufacturing the IGBT die structure of FIG. 1.
Figure 21B:
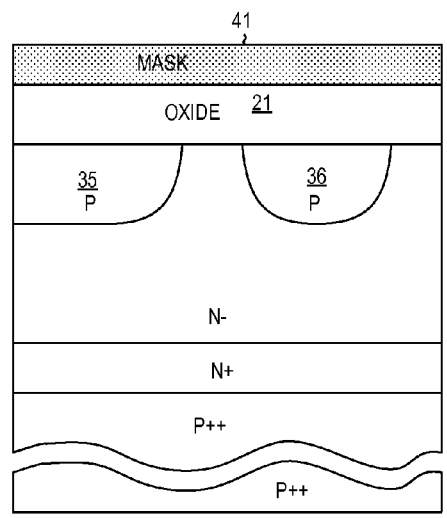
Figure 26A:
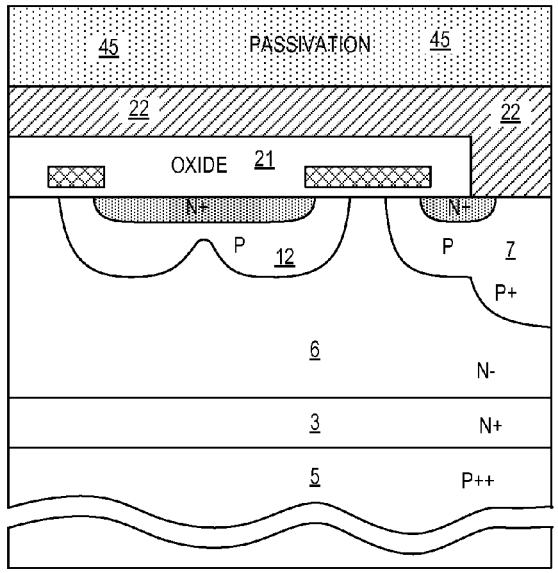
FIGS. 26A and 26B are cross-sectional diagrams that illustrate a twenty-first step in the method of manufacturing the IGBT die structure of FIG. 1.
Figure 26B:
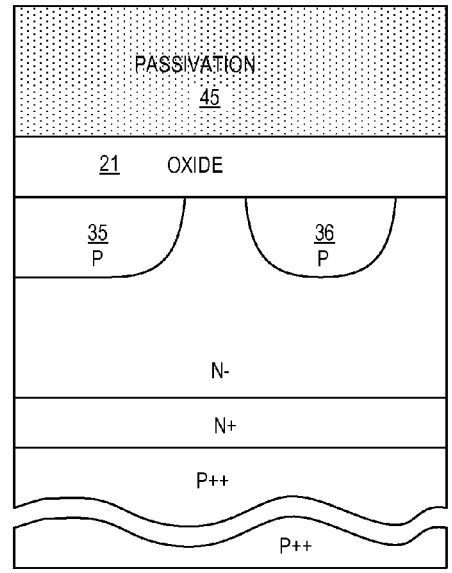
Figure 27A:
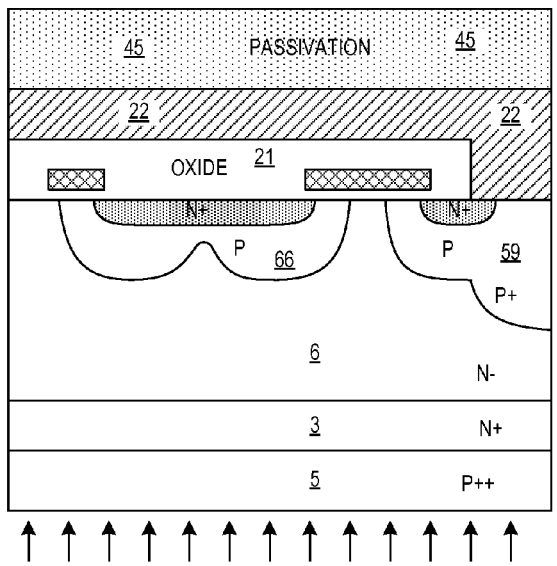
FIGS. 27A and 27B are cross-sectional diagrams that illustrate a twenty-second step in the method of manufacturing the IGBT die structure of FIG. 1.
Figure 27B:
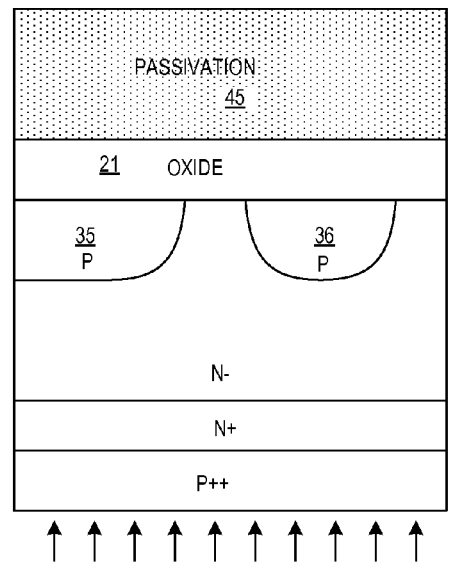
Figure 28A:
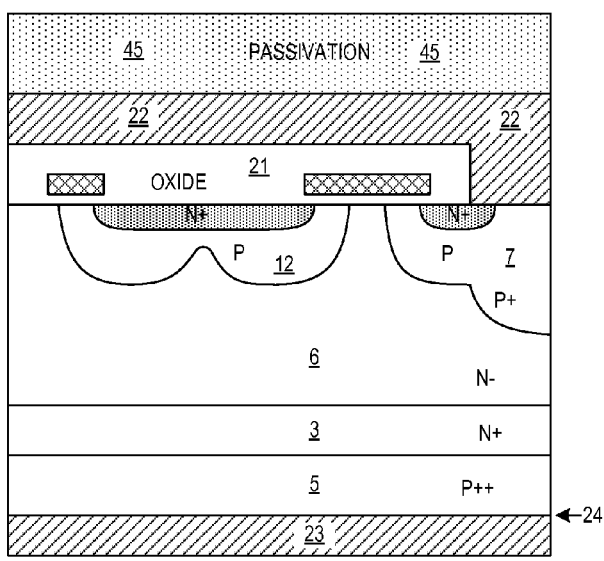
FIGS. 28A and 28B are cross-sectional diagrams that illustrate a twenty-third step in the method of manufacturing the IGBT die structure of FIG. 1.
Figure 28B:
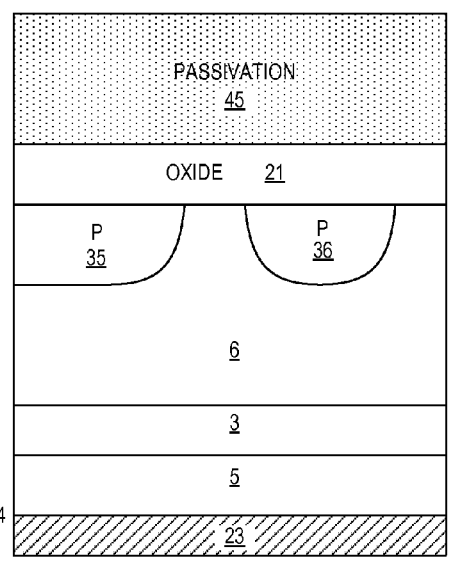

FIGS. 6A through 28A, and 6B through 28B are sets of diagrams that illustrate a method of manufacturing the IGBT die structure of FIG. 1. An N+ type buffer layer is disposed over the top major surface 3 of a P++ type layer. In one example, the P++ type layer is a layer of semiconductor substrate of monocrystalline wafer material and the N+ type buffer layer 3 is formed on the top major surface 4 by epitaxial deposition. An N− drift layer 6 is disposed over the N+ type buffer layer 3. In one example, the N− drift layer 6 is formed by epitaxial deposition as well. This structure, as shown in FIGS. 6A and 6B is the starting material for the process. FIG. 7A and FIG. 7B illustrate a next step in which the entire upper surface of the N− drift layer 6 is implanted with a light dose of phosphorus. The arrows in the diagram represent this implanting. Next, as represented by FIGS. 8A and 8B, the phosphorus dopants are driven in a drive in step, and a sacrificial oxide layer is grown. The sacrificial oxide layer is then etched off, and a quality gate oxide layer 30 is formed. As a result, the surface portion of the N-type drift layer 6 has a slightly higher concentration of N type dopants as compared to the remainder of the N− type drift layer. Alternatively, in another example, the sacrificial oxidation step can occur before the light implantation step of FIG. 7A and FIG. 7B. Next, as shown in FIGS. 9A and 9B, a layer of polysilicon 31 is deposited. Next, as shown in FIGS. 10A and 10B, a polysilicon mask 32 is formed. Next, as shown in FIG. 11A and FIG. 11B, the polysilicon layer is etched to form the gate of the IGBT, including the first gate portion 15 and the second gate portion 16. Next, as shown in FIG. 12A and FIG. 12B, the polysilicon mask is removed. Next, as shown in FIGS. 13A and 13B, a ring mask 33 involving portions 33A, 33B, 33C and 33D is formed. The ring mask 33 is used in a subsequent P type dopant implant step. In the active area, shallow implant regions 34A, 34B and 34C are formed. In the edge termination area, shallow implant regions 34D and 34E are formed. Shallow implant region 34D will form an intermediate P type region 35. Shallow implant region 34E will form a floating ring 36. Although not shown here in this simplified diagram, there are many such rings and other implant regions formed in the edge termination region, as well as an outer channel stopper structure. Only the formation of the intermediate region 35 and the floating ring 36 are set forth in this sequence of diagrams due to space limitations in the drawings. In the active area, shallow implant region 34C will form part of the P type body region 7. Shallow implants 34B and 34A will merge together to form the floating P type well region 12. Next, as illustrated in FIG. 14A and FIG. 14B, the ring mask 33 is removed, and a P+ implant mask 37 is formed. A heavy P+ implant is performed as indicated by the arrows in the diagram, thereby forming the heavily implanted P type implant region 38. The heavy P+ type implant region 38 will form the more heavily doped and deeper portion 10 of the P type body region 7. Next, as shown in FIG. 15A and FIG. 15B, the P+ implant mask 37 is removed, and a drive in step is performed to drive in the P type dopants. Dopants of the two P type shallow implant regions 34A and 34B merge together to form the single floating P type well region 12, where the bottom interface 25 of the floating P type well region 12 to the underlying N− drift layer 6 has the illustrated novel waved form. This is accomplished without adding any additional mask step to the IGBT formation process. Parts of the floating P type well region that correspond to locations directly under the shallow implant regions 34A and 34B are relatively deep, whereas the part of the floating P type well region that corresponds to the location under the mask portion 33B of FIG. 13A is relatively shallow. Accordingly, the features of the P well and ring mask can be set in order to set and tailor the waved contour of the bottom interface surface 25 of the floating P type well region. Next, as shown in FIG. 16A and FIG. 16B, an N+ mask 39 is formed. Next, as shown in FIG. 17A and FIG. 17B, the exposed gate oxide is etched away, and an N+ type dopant implant step is performed as represented by the arrows. As a result, shallow N+ type implant regions 39A and 39B are formed. Next, as shown in FIG. 18A and FIG. 18B, the N+ implant mask is removed. As shown in FIG. 19A and FIG. 19B, the N+ dopants are then driven in to form the floating N+ well region 13 and the N+ type emitter region 11. The separate drive in step of FIG. 19A and FIG. 19B is optional, and the drive in can occur during the next ILD reflow step. As shown in FIG. 20A and FIG. 20B, an ILD (Insulation Layer Deposition) step is performed to deposit an insulation layer 40, and the insulation layer is reflowed to have a relatively planar upper surface. Next, as shown in FIG. 21A and FIG. 21B, an oxide etch mask 41 is formed, and the oxide layer 40 is etched to expose contact areas down to the silicon. There is one such contact area 42 in the center of the P type body region 7. This contact area 42 extends out to expose part of the upper surface of the N+ type emitter region 11. In addition, contact areas down to the polysilicon gate are formed. The location of these contract areas down to the polysilicon gate are not in the cross-sectional view of FIG. 21A or FIG. 21B. The etched layer 40 is the oxide layer 21 of FIG. 1. Next, as shown in FIGS. 22A and 22B, the oxide etch mask 41 is removed. Next, as shown in FIG. 23A and FIG. 23B, topside metal 43 is deposited to cover the entire topside surface of the wafer so that metal extends down into all the exposed contact areas. As is known in the art, the metal deposition step may actually involve multiple different metal deposition steps so that the ultimate metal electrodes will have any necessary barrier metal layers. Next, as shown in FIG. 24A and FIG. 24B, a metal mask 44 is formed. Next, as shown in FIG. 25A and FIG. 25B, the topside metal 43 is etched to form the gate electrode (not shown) and the emitter electrode 22. Metal of the gate electrode makes contact with the polysilicon gate. Metal of the emitter electrode 22 makes contact with the P type body region 7 and the N+ type emitter region 11. The metal mask 44 is removed. Next, as shown in FIG. 26A and FIG. 26B, nitride passivation 45 is deposed over the entire topside of the wafer. A pad mask is formed, and a nitride etch step is performed, and the nitride mask is removed. As a result, contact openings through the nitride passivation 45 are opened to expose bond pad areas on the top of the gate electrode metal and on the top of the emitter electrode metal. Next, as illustrated in FIG. 27A and FIG. 27B, the P++ type semiconductor wafer is thinned by backside grinding. The arrows in the diagram represent backside grinding. Next, as shown in FIG. 28A and FIG. 28B, metal is deposited on the backside (bottomside) surface 24 of the wafer structure, thereby forming the collector electrode 23. The resulting wafer is then diced, and packaged, and tested as is conventional.

Figure 29:
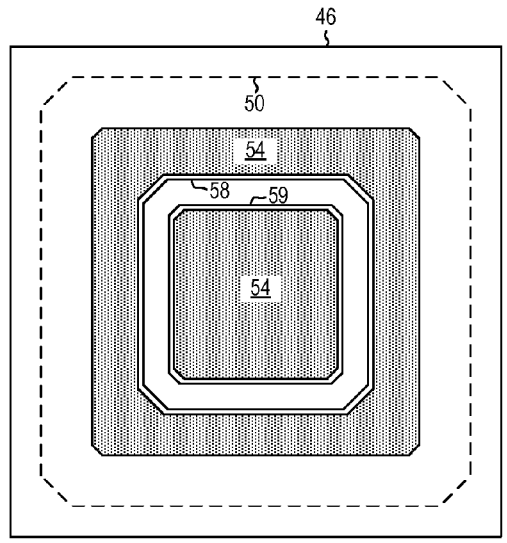
FIG. 29 is a top-down diagram of an IGBT unit cell that has another floating P type well and electron injector geometry and layout in accordance with another novel aspect.
Figure 30:
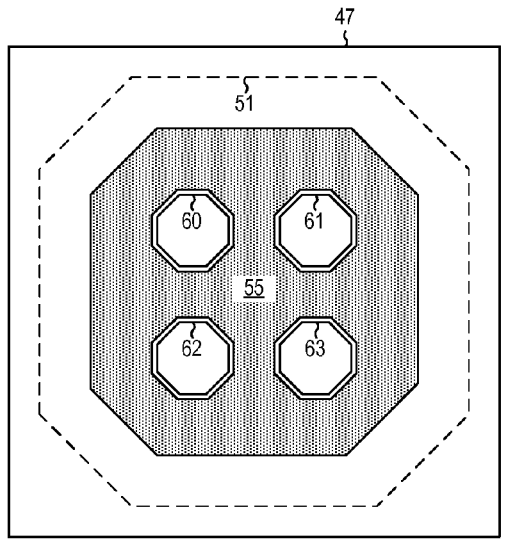
FIG. 30 is a top-down diagram of an IGBT unit cell that has another floating P type well and electron injector geometry and layout in accordance with another novel aspect.
Figure 31:
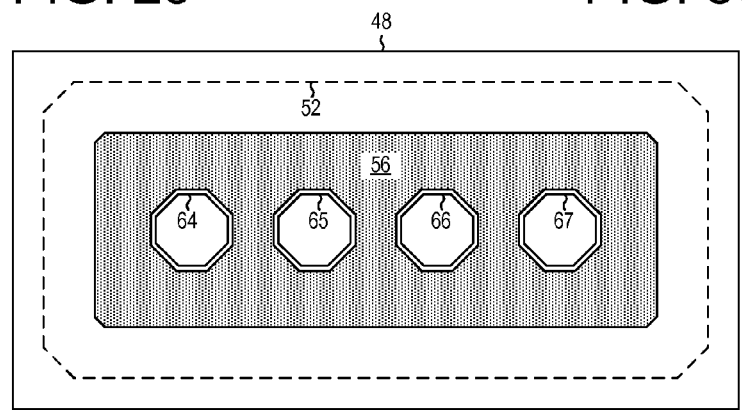
FIG. 31 is a top-down diagram of an IGBT unit cell that has another floating P type well and electron injector geometry and layout in accordance with another novel aspect.
Figure 32:
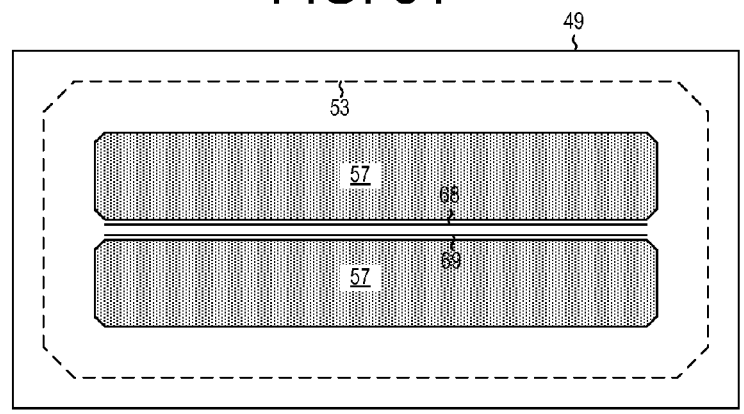
FIG. 32 is a top-down diagram of an IGBT unit cell that has another floating P type well and electron injector geometry and layout in accordance with another novel aspect.

Although an example of the novel floating P type and N+ type well regions is set forth above where the floating P type and N+ type structures of the unit cell have just one coaxial and central opening, and where there is just one circular electron injector portion 20 in the form of a centrally located ring, the novel floating P type and N+ type well regions can have other shapes and geometries in other embodiments. FIGS. 29-32 illustrate several exemplary shapes and geometries. In the diagrams, lines 46-49 represent the outer edges of the pictured unit cells. The dashed lines 50-53 represent the rings formed by the N+ type emitter region or regions. As set forth above, a single N+ type emitter region can extend around and ring and surround the floating P type well region as represented by the dashed line, or alternatively multiple N+ type emitter regions can be disposed in end-to-end fashion so that together they together form the ring represented by the dashed line. The N+ type emitter region or regions need not be one contiguous ring, but rather in some embodiments the N+ type emitter structure that surrounds the floating P type well region has narrow breaks between different lengths of N+ type emitter material. Note, for example, that in the example of FIG. 5 there are four N+ type emitter regions 11A, 11B, 11C and 11D. These four N+ type emitter regions are disposed in a substantially end-to-end fashion so that they together ring and surround a central floating P type well region and its associated floating N+ type well region. In FIGS. 29-32, reference numerals 54-57 represent floating P type well regions. In FIG. 29 there are actually two floating P type well regions, but these two regions are identified by the same reference numeral 54. Likewise, in FIG. 32, there are two floating P type well regions, but these two regions are identified by the same reference numeral 57. The floating N+ type well structures are not shown in FIGS. 29-32. In FIGS. 29-32, reference numerals 58-69 represent electron injector portions. As indicated by FIGS. 29-32, three may be more than one electron injector portion in the IGBT unit cell. Also, as shown in FIGS. 29 and 32, there may be more than one floating P type well region that is surrounded by a ring of one or more N+ type emitter regions. Also, the unit cell may be of various shapes. In the examples of FIGS. 29 and 30, the unit cells and the rings formed by the N+ type emitter region or regions are squares. In the examples of FIGS. 31 and 32, the unit cells and the rings formed by the N+ type emitter region or regions are elongated rectangles. A floating P type well structure may form multiple holes when the floating P type well is considered from the top-down perspective, where each corresponding one of the holes contains a separate ring-shaped electron injector portion. Each of the P type well structures of FIG. 30 and FIG. 31 has four such octagonal holes, where each hole contains an octagonal electron injector portion. Accordingly, the floating P and N+ type structures, and the associated second portions of the gate, can be made to have many different shapes, including shapes not illustrated. The number and locations of the electron injector portions and the number and locations of the thinner portions of the floating P type well region are set to optimize charge carrier concentration and distribution in the underlying N− type drift layer during the IGBT on state.

Although certain specific embodiments are described above for instructional purposes, the teachings of this patent document have general applicability and are not limited to the specific embodiments described above. An IGBT structure can employ the waved floating P type well region with its floating N+ type well region, without the IGBT structure having to have a second channel region, without the IGBT structure having any second portion of its gate over such a second channel region, and without the IGBT structure having to have any electron injector portion of N type semiconductor material disposed at the upper semiconductor surface adjacent any such second channel region.

The aspect of the waved floating P-well can be incorporated into an IGBT structure without the incorporating of the aspect of the electron-injecting field effect transistor. For example, an IGBT structure such as is shown in FIG. 1 may not have the second portion 16 of the gate 14, but rather may have its floating P type and N+ type well regions 12 and 13 extend all the way to the left to line A in FIG. 1 such that the illustrated electron injector portion 20 does not exist in the structure. In such an embodiment, the floating N+ type well region 13 may extend over multiple separate thinner portions of the floating P type well region 12. The waved contour of the bottom of the floating P type well region 12 in this embodiment may have many crests and many troughs.

Moreover, the feature of the floating P type and N+ type well regions 12 and 13 that inject charge carriers into the N− type drift layer 6 is not limited to use in a planar IGBT structure such as is shown in FIG. 1, but rather applies generally to any IGBT structure or topology including trench IGBT structures such as set forth in U.S. Pat. No. 8,344,480 (the entire subject matter of which is incorporated herein by reference). In a trench IGBT structure such the one set forth in FIG. 2b of U.S. Pat. No. 8,344,480, a floating P type well region is disposed in a dummy cell between adjacent gate trenches, and a floating N+ type well region is made to extend down into the floating P type well region. Unlike the structure set forth in FIG. 2B of U.S. Pat. No. 8,344,480, however, the bottom contour of the floating P type well region in accordance with the present invention is made to have a waved contour so that the floating P type well region has thinner portions and thicker portions. The floating P type well region is made to be thicker at the sides where it is adjacent a trench. The floating P type well region with the local bipolar electron-injecting transistors can be implemented in this trench structure without the use of any second channel region. Rather, the floating P type and N+ type well regions may extend all the way from one trench on one side of the dummy cell to the next nearest trench on the other side of the dummy cell without there being any second channel region at the upper semiconductor surface. Alternatively, the floating well structures are not made to extend all the way across the dummy cell, but rather an electron injector portion of the underlying N− drift layer is disposed at the upper semiconductor surface in the center of the dummy cell. A second channel region or multiple channel regions is/are controlled by a second portion of the gate electrode where the gate electrode extends over the dummy cell. Either one or both of the electron-injection bipolar transistor aspect and the electron-injecting floating field effect transistor aspect can be incorporated into a trench IGBT structure such as the trench IGBT structure of FIG. 2b of U.S. Pat. No. 8,344,480. Accordingly, various modifications, adaptations, and combinations of various features of the described embodiments can be practiced without departing from the scope of the invention as set forth in the claims.

What is claimed is:

1. An Insulated Gate Bipolar Transistor (IGBT) die structure comprising:
a P type collector layer;
an N− type drift layer disposed over the P type collector layer;
a P type body region that extends into the N− type drift layer;
an N+ type emitter region, wherein the N+ type emitter region extends into the P type body region from a substantially planar upper semiconductor surface;
a floating P type well region that extends into the N− type drift layer from the substantially planar upper semiconductor surface and that is laterally separated from the P type body region, wherein the floating P type well region is surrounded by one or more of the N+ type emitter regions when the IGBT die structure is considered from a top-down perspective, wherein the floating P type well region substantially surrounds an electron injector portion of the N− type drift layer, wherein the electron injector portion of the N− type drift layer extends up to the substantially planar upper semiconductor surface, wherein the floating P type well region forms a waved bottom interface with the underlying N− type drift layer, and wherein the floating P type well region has at least one thinner portion disposed between two thicker portions;
a floating N+ type well region that extends into the floating P type well region from the substantially planar upper semiconductor surface, wherein the floating N+ type well region extends over the at least one thinner portion;
a gate that has a first portion and a second portion, wherein the first portion of the gate extends over a first channel, wherein the first channel extends from the N+ type emitter region, across a part of the P type body region, across a portion of the N− type drift layer, and across a part of the floating P type well region, to the floating N+ type well region, wherein a second portion of the gate extends over a second channel, wherein the second channel extends from the floating N+ type well region, across a portion of the floating P type well region, to the electron injector portion, wherein in an IGBT transistor on state electrons flow in a current path from the N+ type emitter region, through the first channel to the floating N+ type well region, through the floating N+ type well region to the second channel, through the second channel, and to the electron injector portion of the N− type drift layer;
a first metal terminal, wherein the first metal terminal is coupled to the P type body region and to the N+ type emitter region;
a second metal terminal, wherein the second metal terminal is coupled to the gate; and
a third metal terminal that is coupled to the P type collector layer, wherein the N+ type emitter region is a single N+ type emitter region that by itself substantially rings and substantially surrounds the floating P type well region when the IGBT die structure is considered from the top-down perspective.

2. An Insulated Gate Bipolar Transistor (IGBT) die structure comprising:
a P type collector layer;
an N− type drift layer disposed over the P type collector layer;
a P type body region that extends into the N− type drift layer;
an N+ type emitter region, wherein the N+ type emitter region extends into the P type body region from a substantially planar upper semiconductor surface;
a floating P type well region that extends into the N− type drift layer from the substantially planar upper semiconductor surface and that is laterally separated from the P type body region, wherein the floating P type well region is surrounded by one or more of the N+ type emitter regions when the IGBT die structure is considered from a top-down perspective, wherein the floating P type well region substantially surrounds an electron injector portion of the N− type drift layer, wherein the electron injector portion of the N− type drift layer extends up to the substantially planar upper semiconductor surface, wherein the floating P type well region forms a waved bottom interface with the underlying N− type drift layer, and wherein the floating P type well region has at least one thinner portion disposed between two thicker portions;
a floating N+ type well region that extends into the floating P type well region from the substantially planar upper semiconductor surface, wherein the floating N+ type well region extends over the at least one thinner portion;

a gate that has a first portion and a second portion, wherein the first portion of the gate extends over a first channel, wherein the first channel extends from the N+ type emitter region, across a part of the P type body region, across a portion of the N− type drift layer, and across a part of the floating P type well region, to the floating N+ type well region, wherein a second portion of the gate extends over a second channel, wherein the second channel extends from the floating N+ type well region, across a portion of the floating P type well region, to the electron injector portion, wherein in an IGBT transistor on state electrons flow in a current path from the N+ type emitter region, through the first channel to the floating N+ type well region, through the floating N+ type well region to the second channel, through the second channel, and to the electron injector portion of the N− type drift layer;

a first metal terminal, wherein the first metal terminal is coupled to the P type body region and to the N+ type emitter region;

a second metal terminal, wherein the second metal terminal is coupled to the gate; and a third metal terminal that is coupled to the P type collector layer, wherein the floating P type well region has a substantially octagonal outer periphery when the IGBT die structure is considered from the top-down perspective, wherein the floating P type well region surrounds a substantially octagonal area of N− type semiconductor material at the substantially planar upper semiconductor surface, and wherein the electron injector portion is a part of the substantially octagonal area of N− type semiconductor material.

3. The IGBT die structure of claim 2, wherein the substantially octagonal outer periphery of the floating P type well region has rounded corners.

4. The IGBT die structure of claim 2, wherein the floating P type well region surrounds a plurality of octagonal areas of the N− type semiconductor material, wherein the octagonal areas are coplanar with one another at the substantially planar upper semiconductor surface.

5. An Insulated Gate Bipolar Transistor (IGBT) die structure comprising:
a P type collector layer;
an N− type drift layer disposed over the P type collector layer;
a P type body region that extends into the N− type drift layer;
an N+ type emitter region, wherein the N+ type emitter region extends into the P type body region from a substantially planar upper semiconductor surface;
a floating P type well region that extends into the N− type drift layer from the substantially planar upper semiconductor surface and that is laterally separated from the P type body region, wherein the floating P type well region is surrounded by one or more of the N+ type emitter regions when the IGBT die structure is considered from a top-down perspective, wherein the floating P type well region substantially surrounds an electron injector portion of the N− type drift layer, wherein the electron injector portion of the N− type drift layer extends up to the substantially planar upper semiconductor surface, wherein the floating P type well region forms a waved bottom interface with the underlying N− type drift layer, and wherein the floating P type well region has at least one thinner portion disposed between two thicker portions;

a floating N+ type well region that extends into the floating P type well region from the substantially planar upper semiconductor surface, wherein the floating N+ type well region extends over the at least one thinner portion;

a gate that has a first portion and a second portion, wherein the first portion of the gate extends over a first channel, wherein the first channel extends from the N+ type emitter region, across a part of the P type body region, across a portion of the N− type drift layer, and across a part of the floating P type well region, to the floating N+ type well region, wherein a second portion of the gate extends over a second channel, wherein the second channel extends from the floating N+ type well region, across a portion of the floating P type well region, to the electron injector portion, wherein in an IGBT transistor on state electrons flow in a current path from the N+ type emitter region, through the first channel to the floating N+ type well region, through the floating N+ type well region to the second channel, through the second channel, and to the electron injector portion of the N− type drift layer;

a first metal terminal, wherein the first metal terminal is coupled to the P type body region and to the N+ type emitter region;

a second metal terminal, wherein the second metal terminal is coupled to the gate; and a third metal terminal that is coupled to the P type collector layer, wherein the floating P type well region has a ring-like washer shape that defines a central area, wherein the electron injector portion is disposed in the central area.

6. The IGBT die structure of claim 5, further comprising:
an N+ type buffer layer disposed between the P type collector layer and the N− type drift layer.

7. The IGBT die structure of claim 5, wherein the thinner portion of the floating P type well region is less than half as thick as the thicker portions of the floating P type well region.

8. The IGBT die structure of claim 5, wherein the gate extends over some but not all of the floating N+ type well region, and wherein the gate does not extend over all of the electron injector portion.

9. The IGBT die structure of claim 5, wherein the N+ type emitter region and a plurality of other N+ type emitter regions together substantially ring and substantially surround the floating P type well region when the IGBT die structure is considered from the top-down perspective.

10. The IGBT die structure of claim 5, wherein the first channel includes a first inversion layer portion, an accumulation layer portion, and a second inversion layer portion, wherein the first inversion layer portion extends from the N+ type emitter region and across the part of the P type body region, wherein the accumulation layer portion extends from the first inversion layer portion to the second inversion layer portion, and wherein the second inversion layer portion extends from the accumulation layer portion, across the part of the floating P type well region, and to the floating N+ type well region.

11. The IGBT die structure of claim 5, wherein the floating P type well region has multiple separate thinner portions, wherein each of the multiple separate thinner portions is disposed between two of a plurality of thicker portions, and wherein the floating N+ type well region extends over every one of the multiple separate thinner portions.

12. The IGBT die structure of claim 11, wherein each of the multiple separate thinner portions has a ring shape, and wherein the multiple separate thinner portions are concentric with respect to one another.

13. The IGBT die structure of claim 5, wherein the ring-like washer shape has an octagonal outer periphery when the IGBT die structure is considered from a top-down perspective.

14. A semiconductor device comprising:
a P type collector layer;
an N− type drift layer disposed over the P type collector layer;
a P type body region that extends into the N− type drift layer;
an N+ type emitter region, wherein the N+ type emitter region extends into the P type body region from a substantially planar upper semiconductor surface;
a floating P type well region that extends into the semiconductor device from the substantially planar upper semiconductor surface and that is laterally separated from the P type body region, wherein the floating P type well region surrounds a first electron injector portion of N− type semiconductor material at the substantially planar upper semiconductor surface and also surrounds a second electron injector portion of N− type semiconductor material at the substantially planar upper semiconductor surface, wherein the first and second electron injector portions are separated from one another at the substantially planar upper semiconductor surface by at least an amount of P type semiconductor material of the floating P type well region;
a floating N+ type well region that extends into the floating P type well region from the substantially planar upper semiconductor surface;
a gate that has a first portion and a second portion and a third portion, wherein the first portion of the gate extends over a first channel, wherein the first channel extends from the N+ type emitter region and to the floating N+ type well region, wherein the second portion of the gate extends over a second channel, wherein the second channel extends from the floating N+ type well region, across a first portion of the floating P type well region, to the first electron injector portion, wherein the third portion of the gate extends over a third channel, wherein the third channel extends from the floating N+ type well region, across a second portion of the floating P type well region, and to the second electron injector portion, wherein in a device on state electrons flow from the N+ type emitter region, through the first channel, through the floating N+ type well region, through second channel, and to the first electron injector portion, and also flow from the N+ type emitter region, through the first channel, through the floating N+ type well region, through the third channel, and to the second electron injector portion;
a first metal terminal, wherein the first metal terminal is coupled to the P type body region and to the N+ type emitter region;
a second metal terminal, wherein the second metal terminal is coupled to the gate; and
a third metal terminal that is coupled to the P type collector layer.

15. The semiconductor device of claim 14, wherein the floating P type well region forms a waved bottom interface where the floating P type well region interfaces with the underlying N− type drift layer, wherein the floating P type well region has at least one thinner portion disposed between two thicker portions, and wherein said at least one thinner portion of the floating P type well region is less than half as thick as the thicker portions of the floating P type well region.

16. The semiconductor device of claim 14, wherein the floating P type well region when considered from a top-down perspective has an outer periphery, wherein the outer periphery has a shape taken from the group consisting of: an octagon, a square with rounded corners, a rectangle with rounded corners, a circle, and a ring.

17. The semiconductor device of claim 14, wherein each of the first and second electron injector portions, when considered from a top-down perspective, has an identical shape that is taken from the group consisting of: an octagon, a square with rounded corners, a rectangle with rounded corners, a circle, and a ring.

18. The semiconductor device of claim 14, wherein the first electron injector portion is coupled by a contiguous amount of N type semiconductor material to the N− type drift layer, and wherein the second electron injector is coupled by a contiguous amount of N type semiconductor material to the N− type drift layer.

19. The semiconductor device of claim 14, further comprising:
an N+ type buffer layer disposed between the P type collector layer and the N− type drift layer.

20. An Insulated Gate Bipolar Transistor (IGBT) die structure comprising:
a P type collector layer;
an N− type drift layer disposed over the P type collector layer;
a P type body region that extends into the N− type drift layer;
an N+ type emitter region, wherein the N+ type emitter region extends into the P type body region;
a floating P type well region that extends into the N− type drift layer, wherein the floating P type well region is laterally separated from the P type body region, wherein the floating P type well region laterally adjoins an electron injector portion of N− type semiconductor material;
a floating N+ type well region that extends into the floating P type well region;
a gate that has a first portion and a second portion, wherein the first portion of the gate extends over a first channel, wherein the first channel extends from the N+ type emitter region, across a first part of the P type body region, across a part of the N− type drift layer, across a part of the floating P type well region, and to the floating N+ type well region, and wherein the second portion of the gate extends over a second channel, wherein the second channel extends from the floating N+ type well region, across a second part of the floating P type well region, to the electron injector portion, wherein the first portion of the gate has a ring shape, wherein the second portion of the gate has a ring shape, and wherein the ring shapes of the first and second portions are concentric;
a first metal terminal, wherein the first metal terminal is coupled to the P type body region and to the N+ type emitter region;
a second metal terminal, wherein the second metal terminal is coupled to the gate; and a third metal terminal that is coupled to the P type collector layer, wherein the ring shape of the first portion of the gate is an octagonal shape, and wherein the ring shape of the second portion of the gate is an octagonal shape.

21. The IGBT die structure of claim 20, wherein the floating P type well region forms a waved bottom interface with the underlying N− type drift layer, wherein the floating P type well region has at least one thinner portion disposed between two thicker portions.

22. The IGBT die structure of claim 21, wherein the thinner portion is less than half as thick as the thicker portions, wherein a portion of the floating N+ type well region is an emitter of a local electron-injecting NPN bipolar transistor, wherein a portion of the floating P type well region at the thinner portion is a base of the local electron-injecting NPN bipolar transistor, and wherein a portion of the N− type drift layer adjoining the thinner portion is a collector of the local electron-injecting NPN bipolar transistor.

23. A semiconductor device comprising:
a P type layer;
an N− type drift layer disposed over the P type layer;
a P type body region that extends into the N− type drift layer;
an N+ type region, wherein the N+ type region extends into the P type body region from a substantially planar upper semiconductor surface;
a floating P type well region that extends into the N− type drift layer from the substantially planar upper semiconductor surface and that is laterally separated from the P type body region, wherein the floating P type well region is surrounded by one or more of the N+ type regions when the IGBT die structure is considered from a top-down perspective, wherein the floating P type well region substantially surrounds an electron injector portion of the N− type drift layer, wherein the electron injector portion of the N− type drift layer extends up to the substantially planar upper semiconductor surface, wherein the floating P type well region forms a waved bottom interface with the underlying N− type drift layer, and wherein the floating P type well region has at least one thinner portion disposed between two thicker portions;
a floating N+ type well region that extends into the floating P type well region from the substantially planar upper semiconductor surface, wherein the floating N+ type well region extends over the at least one thinner portion;
a gate that has a first portion and a second portion, wherein the first portion of the gate extends over a first channel, wherein the first channel extends from the N+ type region, across a part of the P type body region, across a portion of the N− type drift layer, and across a part of the floating P type well region, to the floating N+ type well region, wherein the second portion of the gate extends over a second channel, wherein the second channel extends from the floating N+ type well region, across a portion of the floating P type well region, to the electron injector portion, wherein in a device on state electrons flow in a current path from the N+ type region, through the first channel to the floating N+ type well region, through the floating N+ type well region to the second channel, through the second channel, and to the electron injector portion of the N− type drift layer;
a first metal terminal, wherein the first metal terminal is coupled to the P type body region and to the N+ type region;
a second metal terminal, wherein the second metal terminal is coupled to the gate; and
a third metal terminal that is coupled to the P type layer, wherein the floating P type well region has a ring-like washer shape that defines a central area, wherein the electron injector portion is disposed in the central area.

* * * * *